US012799592B2

(12) United States Patent
Holm et al.

(10) Patent No.: US 12,799,592 B2
(45) Date of Patent: Nov. 17, 2026

(54) SUBSTRATE BACKSIDE PROTECTION

(71) Applicant: Picosun Oy, Espoo (FI)

(72) Inventors: Niklas Holm, Masala (FI); Juhana Kostamo, Masala (FI); Marko Pudas, Masala (FI)

(73) Assignee: Picosun Oy, Espoo (FI)

( * ) Notice: Subject to any disclaimer, the term of this patent is extended or adjusted under 35 U.S.C. 154(b) by 1367 days.

(21) Appl. No.: 17/621,036

(22) PCT Filed: Jun. 25, 2019

(86) PCT No.: PCT/FI2019/050492
§ 371 (c)(1),
(2) Date: Dec. 20, 2021

(87) PCT Pub. No.: WO2020/260742
PCT Pub. Date: Dec. 30, 2020

(65) Prior Publication Data

US 2026/0242942 A1 Aug. 20, 2026

(51) Int. Cl.

*C23C 16/455* (2006.01)
*C23C 16/44* (2006.01)
*C23C 16/458* (2006.01)
*H10P 72/76* (2026.01)

(52) U.S. Cl.

CPC .... *C23C 16/45521* (2013.01); *C23C 16/4401* (2013.01); *C23C 16/4585* (2013.01); *H10P 72/7611* (2026.01); *H10P 72/7612* (2026.01); *H10P 72/7614* (2026.01); *C23C 16/45536* (2013.01); *C23C 16/45551* (2013.01)

(58) Field of Classification Search

USPC .......................................... 118/728, 729, 715
See application file for complete search history.

(56) References Cited

U.S. PATENT DOCUMENTS

| | | | |
|---|---|---|---|
| 779,544 | A | 1/1905 | Hyden et al. |
| 5,478,401 | A | 12/1995 | Tsunekawa et al. |
| 5,556,476 | A | 9/1996 | Lei et al. |
| 5,884,412 | A | 3/1999 | Tietz et al. |
| 6,374,512 | B1 | 4/2002 | Guo et al. |

(Continued)

FOREIGN PATENT DOCUMENTS

| | | | |
|---|---|---|---|
| CN | 105555998 | A | 5/2016 |
| CN | 109844175 | A | 10/2021 |

(Continued)

OTHER PUBLICATIONS

English Translation of JP-2010135598A (Year: 2010).*

(Continued)

*Primary Examiner* — Yewebdar T Tadesse
(74) *Attorney, Agent, or Firm* — Espatent Oy

(57) ABSTRACT

A substrate processing apparatus that includes a susceptor having a supporting interface to receive a substrate, a support part having a supporting interface, a moving arrangement for moving the susceptor to bring the substrate into a contact with the supporting interface of the support part, and for further moving the susceptor to detach the substrate from the supporting interface of the susceptor, and an inlet to provide a protective fluid flow into a space in between the substrate and the support part, and a related method.

13 Claims, 18 Drawing Sheets

(56) References Cited

U.S. PATENT DOCUMENTS

| | | | |
|---|---|---|---|
| 6,818,067 B2 | 11/2004 | Doering et al. | |
| 9,428,833 B1 | 8/2016 | Duvall et al. | |
| 9,460,915 B2 | 10/2016 | Varadarajan et al. | |
| 10,161,038 B2 | 12/2018 | Kilpi et al. | |
| 2006/0124060 A1 | 6/2006 | Tanaka et al. | |
| 2006/0196418 A1 | 9/2006 | Lindfors et al. | |
| 2010/0264115 A1 | 10/2010 | Kawamura et al. | |
| 2011/0020545 A1* | 1/2011 | Kim .................... | C23C 16/4584 118/725 |
| 2012/0309175 A1 | 12/2012 | Masumura | |
| 2014/0030445 A1 | 1/2014 | Vermeer et al. | |
| 2014/0053779 A1 | 2/2014 | Martinson et al. | |
| 2014/0216332 A1 | 8/2014 | Omori et al. | |
| 2016/0035566 A1 | 2/2016 | Lavoie et al. | |
| 2016/0177444 A1 | 6/2016 | Baldasseroni et al. | |
| 2016/0204005 A1 | 7/2016 | Oki et al. | |
| 2018/0155823 A1 | 6/2018 | Matsumoto et al. | |
| 2018/0371640 A1 | 12/2018 | Yu et al. | |

FOREIGN PATENT DOCUMENTS

| | | | | |
|---|---|---|---|---|
| EP | 0825279 A1 | 2/1998 | | |
| EP | 2837711 A1 | 2/2015 | | |
| JP | H08191097 A | 7/1996 | | |
| JP | H09027538 A | 1/1997 | | |
| JP | 2002534786 A | 10/2002 | | |
| JP | 2003197532 A | 7/2003 | | |
| JP | 2010135598 A | 6/2010 | | |
| JP | 2020053627 A | * | 4/2020 | .......... H10P 72/7614 |
| KR | 20050076609 A | 7/2005 | | |
| KR | 20080092766 A | 10/2008 | | |
| KR | 20120069962 A | * | 6/2012 | ......... C23C 16/4585 |
| KR | 101557590 B1 | 10/2015 | | |
| TW | 200528827 A | 9/2005 | | |
| TW | 201542861 A | 11/2015 | | |
| TW | 201545264 A | 12/2015 | | |
| TW | 201839165 A | 11/2018 | | |
| WO | 2011065776 A2 | 6/2011 | | |
| WO | 2014207289 A1 | 12/2014 | | |
| WO | 2018065852 A2 | 4/2018 | | |
| WO | 2018146370 A1 | 8/2018 | | |

OTHER PUBLICATIONS

English Translation of JP-2020053627A (Year: 2020).*

English translation of KR-20120069962A (Year: 2012).*

Japenese Patent Office, Notice of reasons for refusal, Patent Application No. 2023-059904, Date of Mailing Jul. 2, 2024, 7 Pages.

China Patent Office, Search Report, Application No. 2019800978250, dated Aug. 7, 2023, 3 pages.

European Patent Office, Extended European Search Report, Application No. 19935031.5-1211/3990680 PCT/FI2019050492, dated Dec. 9, 2022, 9 pages.

Japan Patent Office, Notification of Ground of Rejection, Application No. 2021-576430, Mailed Aug. 3, 2022, 7 pages.

International Search Report, Swedish Patent Office, Application No. PCT/FI2019/050492, mailed Feb. 11, 2020, 5 pages.

Taiwan Patent Office, Search Report, Application No. 109116429, completed May 24, 2021, 1 page, English Translation Attached.

Written Opinion of the International Searching Authority, Swedish Patent Office, Application No. PCT/FI2019/050492, mailed Feb. 11, 2020, 5 pages. 5 pages.

Korea Patent Office, Notice of Allowance Application No. 10-2022-7001450, mailed May 4, 2022, 2 pages. English Translation, 2 pages.

* cited by examiner

SUBSTRATE BACKSIDE PROTECTION

FIELD

The aspects of the disclosed embodiments generally relate to substrate processing methods and apparatus, in particular to chemical deposition methods and deposition reactors. More particularly, but not exclusively, the invention relates to atomic layer deposition (ALD) reactors.

BACKGROUND

This section illustrates useful background information without admission of any technique described herein representative of the state of the art.

For certain applications it is of utmost importance that the contamination of substrates by undesired particles is minimized. For example, masks transparent or reflective to used radiation may be highly sensitive to undesired particles on their surfaces.

SUMMARY

Accordingly, of the aspects of the disclosed embodiments provide a method and apparatus with minimized particle generation of undesired particles, or at least to provide an alternative to existing technology. A further aspect of the disclosed embodiments is to prevent backside growth on a substrate or substrates.

According to a first example aspect of the disclosed embodiments there is provided a method in a substrate processing apparatus, comprising:

- receiving a substrate by a supporting interface of a susceptor;
- moving the susceptor to bring the substrate into a contact with a supporting interface of a support part;
- further moving the susceptor to detach the substrate from the supporting interface of the susceptor; and
- causing a protective fluid flow into a space in between the substrate and the support part.

In certain embodiments, the substrate processing apparatus is a deposition reactor. In certain embodiments, the substrate processing apparatus is a vacuum deposition reactor. In certain embodiments, the substrate processing apparatus is a cleaning apparatus. In certain embodiments, the substrate processing apparatus is an etching apparatus. In certain embodiments, the substrate processing apparatus is a deposition reactor configured to perform sequential self-saturating surface reactions on the substrate surface. In certain embodiments, the substrate processing apparatus is an atomic layer deposition, ALD, reactor. In certain embodiments, the substrate processing apparatus is a molecular layer deposition, MLD, reactor. In certain embodiments, the substrate processing apparatus is a plasma enhanced atomic layer deposition, PEALD, reactor. In certain embodiments, the substrate processing apparatus is a photo-enhanced atomic layer deposition reactor, for example enhanced with UV-light (UV-ALD). In certain embodiments, the substrate processing apparatus operates in vacuum. The quality of vacuum may be different in different parts of the apparatus.

In certain embodiments, the supporting interface of the susceptor receives the substrate from an end effector. In certain embodiments, the end effector operates via a load lock. In certain embodiments, the susceptor receives the substrate in a reaction chamber. In certain embodiments, the end effector brings the substrate onto the top of the supporting interface of the susceptor by a horizontal movement. In certain embodiments, the end effector brings the substrate onto the top of the supporting interface of the susceptor from a side. In certain embodiments, the supporting interface of the susceptor is moved vertically to contact the substrate and to detach (lift) the substrate from the end effector. In certain embodiments, the end effector is thereafter pulled away from below the substrate.

In certain embodiments, the substrate is lowered to contact with a susceptor by vertical motion of an actuating robot.

In certain embodiments, the supporting interface of the susceptor carries the substrate. In certain embodiments, the supporting interface of the susceptor is lowered until the substrate contacts a supporting interface of a support part. In certain embodiments, the support part is a base part or bottom part. In certain embodiments, the support part is a chuck.

In certain embodiments, the supporting interface of the susceptor is further lowered detaching the substrate from the supporting interface of the susceptor and leaving the substrate on the supporting interface of the support part.

In certain embodiments, the lowering of the supporting interface of the susceptor is effected by lowering the susceptor as a whole. In certain embodiments, the support part comprises pockets to receive the lowered susceptor or parts of the lowered susceptor. In certain embodiments, the support part comprises a pocket at opposite sides of the substrate, i.e., on left and right side.

In certain embodiments, the general shape (horizontal cross-sectional shape) of the support part is adapted to the shape of the substrate (e.g., rectangular, round, cylindrical).

In certain embodiments, the susceptor is attached to a reaction chamber lid. In certain embodiments, the movement of the susceptor (and its supporting interface) is effected by moving the reaction chamber lid attached thereto.

In certain embodiments, there is provided a vertically movable frame part having an opening. In certain embodiments, the frame part is provided with an opening that is smaller in its dimensions than the area reserved for the substrate. In other words, the frame part is an inwardly extending frame part with regard to the substrate. In certain embodiments, the frame part has edges extending below the level of the substrate surface or both surfaces (top and bottom surface).

In certain embodiments, there is provided a gap (first gap) between the frame part and the substrate. In certain embodiments, the frame part is lowered onto the substrate leaving the first gap therebetween. In certain embodiments, the gap is tight so that it only allows fluid with a horizontal component to pass. In certain embodiments, the frame part comprises an edge with a round or rounded cross section. In certain embodiments, this is to provide a round or rounded edge at least partially against the substrate or an edge (or sharp edge) of the substrate.

In certain embodiments, the frame part is attached to the susceptor or the frame part forms part of the susceptor. In certain embodiments, the frame part is attached to the reaction chamber lid or the combination of the frame part and susceptor is attached to the reaction chamber lid. In certain embodiments, the vertical movement, e.g., lowering of the frame part is effected by lowering the reaction chamber lid. In certain embodiments, the susceptor, frame part and reaction chamber lid form a whole that is vertically movable as a whole.

In certain embodiments, there is provided a gap (second gap) between the frame part (or bottom surface of the frame part) and the support part.

In certain embodiments, the substrate is a rectangular substrate having a top face and a bottom face. In certain embodiments, the substrate further comprises side face(s) or side portions than connect the top and bottom faces. In certain embodiments, the side faces comprise a front face, a back face, a right face, and a left face. In certain embodiments, the size of the side faces is only a fraction of the size of the top and bottom faces. The sides (front, back, right, and left) are determined in accordance with the loading direction in which the end effector or other loader load the substrate into the reaction chamber in which the susceptor is waiting.

In certain embodiments, the substrate is cylindrical. In certain embodiments, the substrate or cylindrical substrate has a continuous edge around it.

In certain embodiments, the substrate is touched at substrate edges only, or sharp edges only. In certain embodiments, the supporting interface of the susceptor and the supporting interface of the support part touch the substrate at different edges than the end effector does. For example, in certain embodiments, the end effector touches the substrate at the edge between the bottom face and the back face and at the edge between the bottom face and the front face whereas the supporting interface of the susceptor and the supporting interface of the support part touches the substrate at the edge between the bottom face and the left face and at the edge between the bottom face and the right face. An edge herein means a line segment or borderline between two faces of the substrate, such as a bottom face and side face.

The supporting interface of the susceptor in certain embodiments is a pin interface comprising at least 3 pins at different sides e.g. opposite sides to touch the substrate from different directions to balance the substrate. In certain embodiments, the pin interface comprises two pins at one side and one pin at the opposite side. In certain other embodiments, the pin interface comprises two pins at both sides (4 pins altogether). Similarly, the supporting interface of the support part is a pin interface comprising at least 3 pins at different sides e.g. opposite sides to touch the substrate from different directions to balance the substrate. In certain embodiments, where the pin interface of the susceptor had two pins at one side and one pin at the opposite side the pin interface of the support part has only one pin at the side where the susceptor pin interface had two pins, and two pins at the side where the susceptor pin interface only one pin. In certain embodiments, the pin interface(s) only has only pin per side. There can then be one pin at three or four sides of the substrate in case of a rectangular substrate.

The end effector in certain embodiments also has a supporting interface, in certain embodiments a pin interface with pins (3 or 4 or more pins) to touch the substrate at the edges.

In certain embodiments, the substrate is touched (or held, or supported) only at the edges. The shape of the pins in certain embodiments is such that it enables touching the substrate by an oblique angle. In certain embodiments, the end profile of the pins is conical or spherical, for example, in the form of a semi sphere minimizing the contact area of the touch. Accordingly, in certain embodiments, the substrate is supported without touching the main surfaces, i.e., the top and bottom surface at all.

In certain embodiments, one or more of the supporting interfaces are implemented by a set of grooved parts with holes.

In certain embodiments, the substrate is a rounded substrate, for example, a circular substrate. Also in these embodiments, the substrate may be touched at substrate edges only. And, the touching of the substrate by different parts may occur at different side edges as described.

In certain embodiments, the pins of the susceptor and the pins of the support part are in alignment at different sides of the substrate (or along the same arch in case of a rounded substrate) to minimize horizontal displacement at the point where the pins of the susceptor leave the substrate onto the pins of the support part.

In certain embodiments, the protective fluid flow into the space in between the substrate and the support part is provided by a gas (or fluid) inlet in the support part. In certain embodiments, the gas inlet is positioned at a recessed area in the support part underneath the substrate. In certain embodiments, the recessed area under the substrate extends close to the edge(s) of the substrate. In certain embodiments, the recessed area under the substrate is separated from the edge(s) by a ridge. In certain embodiments, there is a small gap (third gap) between (an upper surface of) the ridge and the bottom face of the substrate. In certain embodiments, the recessed area has an equal vertical distance in each place from the bottom face of the substrate. In certain embodiments, the recessed area does not have a step edge, but an evenly decreasing vertical distance towards the edges of the substrate.

In certain embodiments, the protective fluid flows from the inlet into the recessed area and therefrom along the bottom face of the substrate and via the third gap onto sides of the substrate (the protective fluid flows also to the susceptor pockets on those sides that contain pockets). From the sides (or side portions) of the substrate the protective fluid flow in certain embodiments is divided into two routes. The first route extends via the first gap onto the top face of the substrate. The flow via the first gap causes a counter pressure that prevents reactive chemical that is present on the top face from entering into the first gap. The second route extends via the second gap into exhaust cleaning the pocket (s). However, in certain embodiments, only the first route exists. In certain embodiments, the protective fluid flow is controlled with such means as mass flow controller or valve(s) or their combination(s) to maintain the flow as the same, adjust the flow along the process cycles, or vary the flow at different stages of a process cycle. In certain embodiments, a protective fluid flow control may change the flow direction at any point or in any gap between described parts, such as, the substrate, the frame, or the substrate holder (or susceptor).

In certain embodiments, a thermal sensor, such as an optical sensor, is aligned to point towards the substrate from the bottom, but located outside of the reaction chamber.

In certain embodiments, the reaction chamber is lowered to create a loading opening. In certain embodiments, the support part is lowered/risen with the chamber.

In certain embodiments, a door or hatch in the reaction chamber wall is opened to create a loading opening.

According to a second example aspect of the disclosed embodiments there is provided a substrate processing apparatus, comprising

- a susceptor having a supporting interface to receive a substrate;
- a support part having a supporting interface;
- a moving arrangement for moving the susceptor to bring the substrate into a contact with the supporting interface of the support part, and for further moving the susceptor to detach the substrate from the supporting interface of the susceptor; and
- an inlet to provide a protective fluid flow into a space in between the substrate and the support part.

The moving arrangement may comprise an actuator, or actuating means.

In certain embodiments, the supporting interfaces are configured to contact the substrate at substrate edges only.

In certain embodiments, the supporting interfaces are pin interfaces and the number of pins of the respective pin interfaces is three or four.

In certain embodiments, the apparatus is configured to bring the substrate into a contact with the supporting interface of the support part by a lowering movement of the susceptor.

In certain embodiments, the apparatus comprises:

side pockets in the support part to receive the lowered susceptor or parts of the lowered susceptor.

In certain embodiments, the apparatus comprises:

a reaction chamber lid attached to the susceptor to effect the movement of the susceptor by moving the reaction chamber lid.

In certain embodiments, the apparatus comprises:

a frame part to be lowered onto the substrate, optionally leaving a gap therebetween.

In certain embodiments, the apparatus comprises:

an inlet and a recessed area in the support part to flow a protective fluid from the inlet to the recessed area underneath the substrate and therefrom to side pockets of the support part.

In certain embodiments, the route from the recessed area to the side pockets travels over a ridge contained by the support part.

In certain embodiments, the apparatus is further configured to provide a gap in between the frame part and the substrate to flow the protective fluid via said gap onto a top surface of the substrate.

In certain embodiments, the apparatus comprises:

an upper counter surface, the apparatus being configured to detach by a lowering movement the reaction chamber from the upper counter surface to form a loading opening.

In certain embodiments, the apparatus comprises a vacuum chamber around a reaction chamber.

In certain embodiments, the apparatus comprises a flow dispersion insert in the support part. In certain embodiments, the flow dispersion part is removable. In certain embodiments, the flow dispersion part is a flow dispersion plate. In certain embodiments, the flow dispersion part is fitted into the recessed area of the support part (or base part). In certain embodiments, the flow dispersion part is configured to disperse the protective fluid flow sideways (or horizontally).

In certain embodiments, the apparatus comprises a heat reflector around a reactive gas in-feed part (such as a plasma in-feed part) on top of the reaction chamber or reaction chamber lid. In certain embodiments, the heat reflector is in the form of a heat reflector plate or plates. In certain embodiments, the heat reflector extends vertically around the reactive gas in-feed part. In certain embodiments, the said heat reflector is additional to a heat reflector plate or plates horizontally oriented on top of the reaction chamber.

In certain embodiments, the apparatus is configured to deposit material on a top surface of the substrate by sequential self-saturating surface reactions.

In certain embodiments, the apparatus is a photon-enhanced atomic layer deposition reactor or a plasma-enhanced atomic layer deposition reactor.

According to a third aspect of the disclosed embodiments there is provided a method in a substrate processing apparatus, comprising:

receiving a substrate by a substrate supporting lifter;

actuating a movement reducing a vertical distance between the lifter and a support part;

accommodating at least a part of the lifter within the support part; and causing a protective fluid flow into a space in between the substrate and the support part.

In certain embodiments, said accommodating means that a part that another part accommodates is within the said another part. In certain embodiments, the part accommodated by the support part comprises at least supporting elements (pins, or other supporting elements) that support the substrate. In certain embodiments, the support part comprises a channel for protective fluid in-feed.

In certain embodiments, a reaction chamber is lifted against or towards a reaction chamber lid or another top attachment part, as the case may be. In certain embodiments, both the reaction chamber and its lid are vertically movable.

In certain embodiments, the substrate supporting lifter is a part that is capable of supporting the substrate, and capable of raising and/or lowering the substrate.

In certain embodiments, the substrate supporting lifter forms part of a susceptor, or the susceptor forms part of the substrate supporting lifter.

Any of the embodiments or features of the embodiments of the first aspect may be combined with the third aspect or its embodiments either separately or in combination with other features or embodiments of the first aspect.

According to a fourth aspect of the disclosed embodiments there is provided a substrate processing apparatus, comprising:

a substrate supporting lifter to receive a substrate;

a support part;

a moving arrangement for actuating a movement to reduce a vertical distance between the lifter and the support part, the support part being configured to accommodate at least a part of the lifter; and an inlet to provide a protective fluid flow into a space in between the substrate and the support part.

The moving arrangement may comprise an actuator, or actuating means.

Any of the embodiments or features of the embodiments of the second aspect may be combined with the fourth aspect or its embodiments either separately or in combination with other features or embodiments of the second aspect.

Different non-binding example aspects and embodiments have been illustrated in the foregoing. The above embodiments are used merely to explain selected aspects or steps that may be utilized in implementations of the present invention. Some embodiments may be presented only with reference to certain example aspects. It should be appreciated that corresponding embodiments apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

Figure 1A:
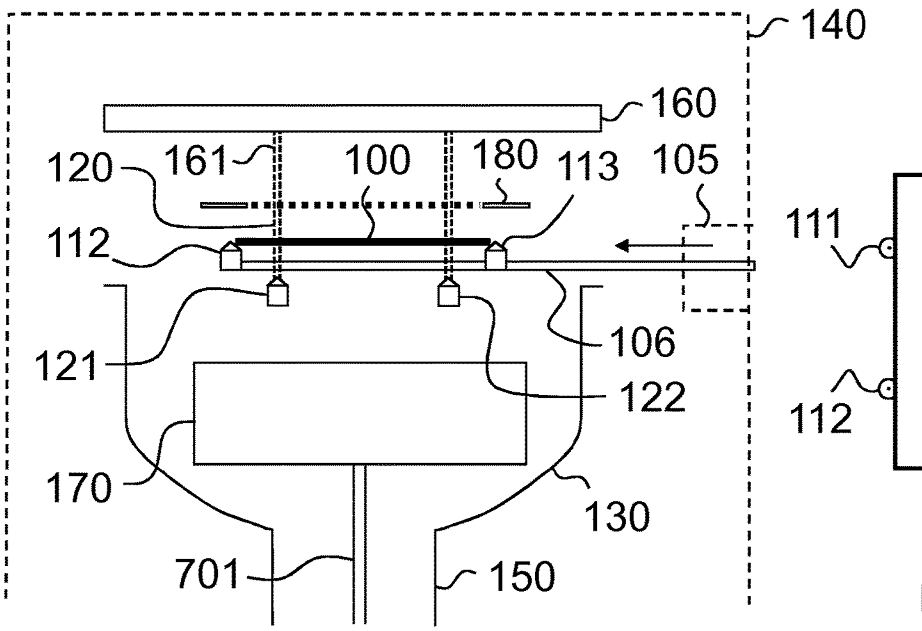
FIGS. 1*a* and 1*b* show supporting a substrate by an end effector during a loading stage in certain embodiments.

In the following description, Atomic Layer Deposition (ALD) technology is used as an example. However, the invention is not limited to ALD technology, but it can be exploited in a wide variety of substrate processing apparatuses, for example, in Chemical Vapor Deposition (CVD) and Atomic Layer Etching (ALE) reactors.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. For example, deposition of a pure element, such as metal, requires only one precursor. Binary compounds, such as oxides can be created with one precursor chemical when the precursor chemical contains both of the elements of the binary material to be deposited. Thin films grown by ALD are dense, pinhole free and have uniform thickness.

The at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-enhanced Atomic Layer Deposition (known also as flash enhanced ALD). The process can also be an etching process, one example of which being an ALE process.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. On the other hand, photo-enhanced ALD has a variety of options, such as only one active precursor, with various options for purging. All these deposition cycles form a timed deposition sequence that is controlled by a logic unit or a microprocessor.

A reaction space is a defined volume within a reaction chamber. The desired chemical reactions occur in the reaction space.

FIGS. 1-10 show embodiments in which a substrate is loaded into a reaction chamber of a substrate processing apparatus during a loading sequence and/or is processed therein. For the sake of readability, all reference numbers are not presented in every figure.

Figure 1B:
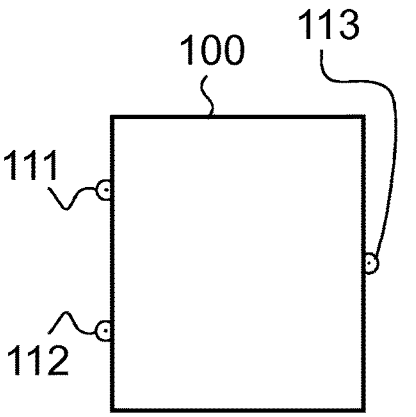

FIGS. 1*a* and 1*b* show supporting a substrate 100 by an end effector 106 during a loading stage in certain embodiments.

The substrate 100 may a rectangular substrate having a top face and a bottom face (alternatively, the substrate may be of another shape, such as a round or cylindrical substrate). The top face and bottom face are connected by sides or side faces. The side faces comprise a front face, a back face, a right face, and a left face. The faces may be determined in accordance with the loading direction in which the end effector 106 loads the substrate 100 into a reaction chamber 130. The lines or borders where the top or bottom faces meet the side faces are defined as edges. In certain embodiments, the substrate is a mask. In certain embodiments, the thickness of the substrate is 4 mm or more. In certain embodiments, the substrate is made of quartz.

The end effector 106 moves the substrate 100 by a horizontal movement via a load lock 105 into the reaction chamber 130. FIG. 1*a* shows a reaction chamber lid 160 in an open position forming a loading opening in between the (raised) reaction chamber lid 160 and reaction chamber side wall. The horizontal arrow in FIG. 1 illustrates the horizontal movement of the end effector 106.

The end effector 106 comprises support pins 111-113 to support (carry) the substrate. Three pins are required to support the substrate 100. The pins support the substrate 100 at the edges only. In the presented example, there are two pins 111,112 supporting the substrate 100 at the edge connecting the bottom face and front face of the substrate and one pin 113 supporting the substrate 100 at the edge connecting the bottom face and back face of the substrate. This is illustrated in the top view shown in FIG. 1*b*.

The substrate processing apparatus comprises a susceptor 120 that has a pin interface. The susceptor 120 is vertically movable. In certain embodiments, the susceptor 120 is attached to the reaction chamber lid 160. The apparatus can comprise a connecting element 161, such as a vertical bar connecting the susceptor 120 and the lid 160. Accordingly, in certain embodiments, the movement of the susceptor 120 (and its pin interface) is effected by moving the reaction chamber lid 160 attached thereto.

In the example shown in FIG. 1*a*, the substrate processing apparatus further comprises a vertically movable frame (or frame part, or containment plate) 180. The frame part 180 is attached to the susceptor 120 or the frame part 180 forms part of the susceptor 120. The frame part 180 is positioned directly on top of the substrate 100 so that it frames the border areas of the underlying substrate 100.

In certain embodiments, the frame part 180 is attached to the reaction chamber lid 160 or the combination of the frame part 180 and susceptor 120 is attached to the reaction chamber lid 160. The frame part 180 and the susceptor 120 may be fixedly attached to the connecting element 161. In certain embodiments, vertical movement, e.g., lowering of the frame part 180 is effected by lowering the reaction chamber lid 160. In certain embodiments, the susceptor 120, frame part 180 and reaction chamber lid 160 form a whole that is vertically movable as a whole. In certain other embodiments, the frame part 180 is moved independently of the other parts by a separate actuator.

The substrate processing apparatus further comprises a support part (or base part) 170. In certain embodiments, the support part 170 is a chuck. In certain embodiments, the support part 170 is configured to receive and accommodate the susceptor 120 or at least part of the susceptor 120.

The apparatus comprises a protective fluid in-feed line 701 for flowing protective fluid into the support part. The protective fluid in this and other embodiments may be $N_2$. In other embodiments, instead of $N_2$ another gas is used, for example, Ne, Ar, Kr or Xe, or any other gas molecule which is suitable for used deposition reaction. The in-feed line 701 may be routed via and/or inside an exhaust line 150 positioned on the bottom of the reaction chamber 130. The in-feed line 701 may be adopted to heat the incoming gas, or heated gas may be guided into it. The protective fluid can be heated or cooled by external means (not shown) before the fluid enters into contact with the substrate 100.

The reaction chamber 130 may be surrounded by a further chamber, a vacuum chamber 140. However, it is to be noted that since the reaction chamber 130 is operable in vacuum conditions, the reaction chamber 130 also is a vacuum chamber.

Figure 2A:
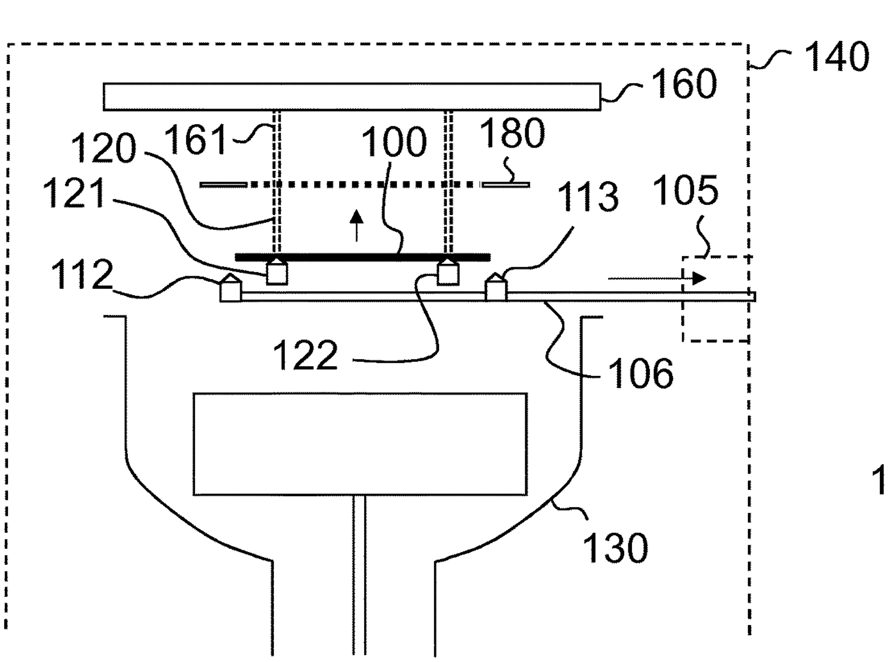
FIGS. 2*a* and 2*b* show receiving the substrate by a susceptor in certain embodiments.

FIG. 1*a* shows the horizontal loader (end effector) 106 supporting the substrate 100 centrally located in the reaction chamber 130. Now, as illustrated by FIG. 2*a*, the susceptor 120 with its pin interface is lifted so that the pins of the susceptor pin interface contact the edges of the substrate 100 and further lift the substrate 100 upwards to detach the substrate 100 from the pins of the end effector 106. The end effector 106 is retracted from the reaction chamber 130 via the load lock 105 as depicted by the horizontal arrow in FIG. 2*a*.

Three pins are required to support the substrate 100. The pins support the substrate 100 at the edges only. In the presented example, there are two pins 121,122 supporting the substrate 100 at the edge connecting the bottom face and left face of the substrate and one pin 123 supporting the substrate 100 at the edge connecting the bottom face and right face of the substrate. This is illustrated in the top view shown in FIG. 2*b*.

Figure 3:
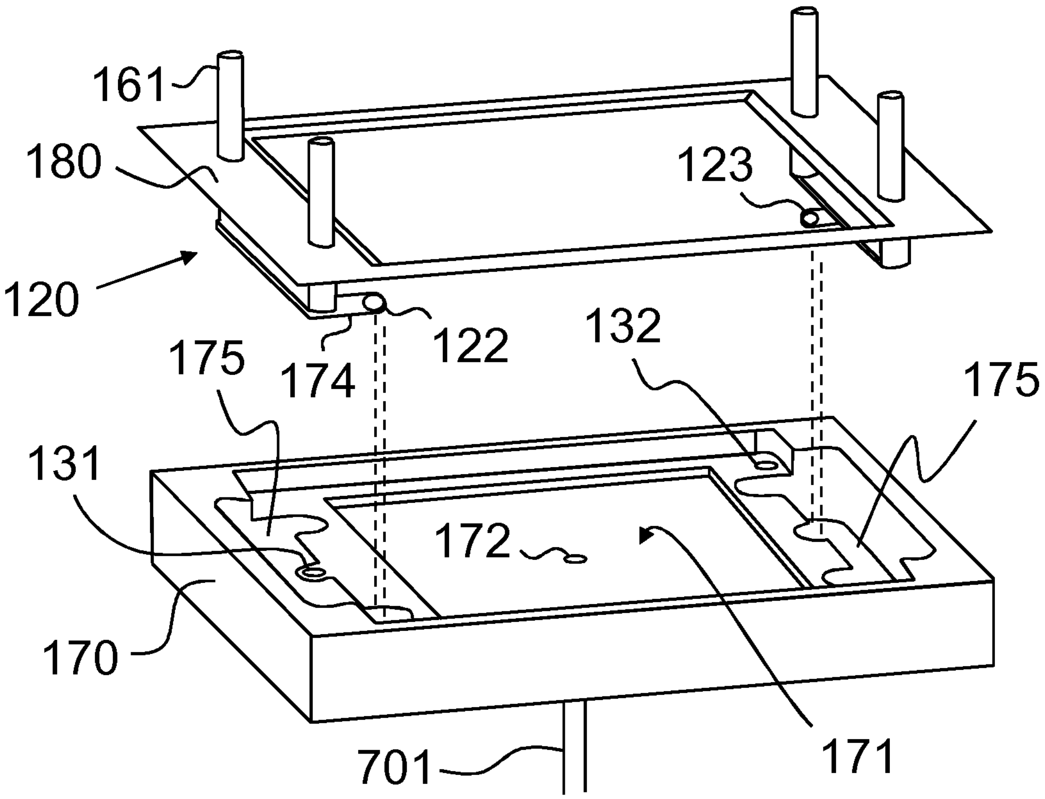
FIG. 3 shows a perspective view of the susceptor and a support part in certain embodiments.

FIG. 3 shows a perspective view of the susceptor 120 and support part 170 in accordance with certain embodiments. The figure shows the frame 180 fixed to four connecting elements 161. The connecting elements 161 are fixed at their bottom portions to horizontally protruding members 174 that provide the pin interface of the susceptor 120. The pins 122 and 123 are visible in FIG. 3.

The support part 170 comprises a recessed area 171 that remains under the bottom face of the substrate (not shown in FIG. 3). The recessed area 171 contains a fluid inlet 172 to flow protective gas into a volume delimited by the substrate bottom face and the recessed area 171. The protective gas may be the same inert gas that is used as carrier gas and/or purge gas in other inlets of the apparatus. Or, the protective gas may be a different gas, for example, Ar, Kr or Xe. The support part 170 further comprises pockets 175 to receive the susceptor 120 when lowered to a substrate processing position as well as a pin interface (of which support pins 131 and 132 are visible at opposite sides of the support part 170 in FIG. 3) for supporting the substrate during processing. These functions will be described in greater detail later in this description.

Figure 4:
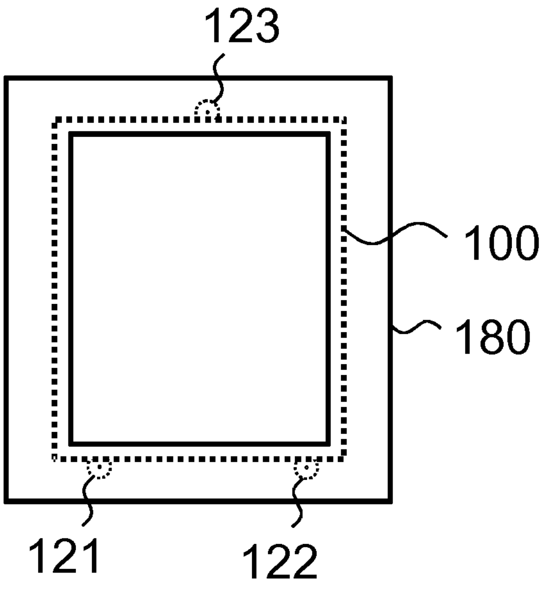
FIG. 4 shows a top view illustrating the positioning of the substrate in certain embodiments.

FIG. 4 shows a top view illustrating the positioning of the substrate 100 in certain embodiments. In the shown scenario the substrate is supported by its edges by the support pins 121-123 of the susceptor. The frame 180 which has a centrally located rectangular opening is inwardly protruding with regard the substrate 100 so that it frames the border areas of the underlying substrate 100. In some embodiments, the frame opening overlaps the substrate surfaces by at least 0.01 mm, in some embodiments 0.1 mm, and in dome embodiments 1 mm. In other embodiments, the frame opening is exactly the same shape and size as the substrate. In other embodiments, the frame is opening larger than the substrate by at least 0.01 mm, or by 0.1 mm in some embodiments, and 1 mm in some embodiments. In some embodiments, the overlapping or exposure of area of the susceptor or substrate holder under the substrate varies, for example on the edges where the gas flow is different.

Figure 2B:
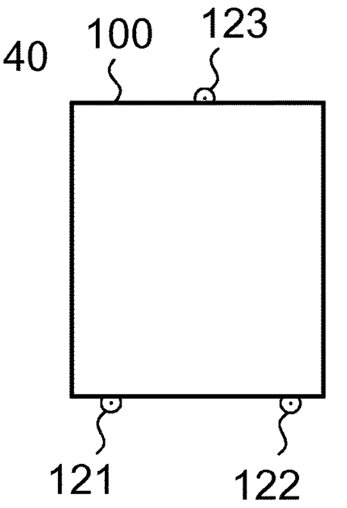
Figure 5A:
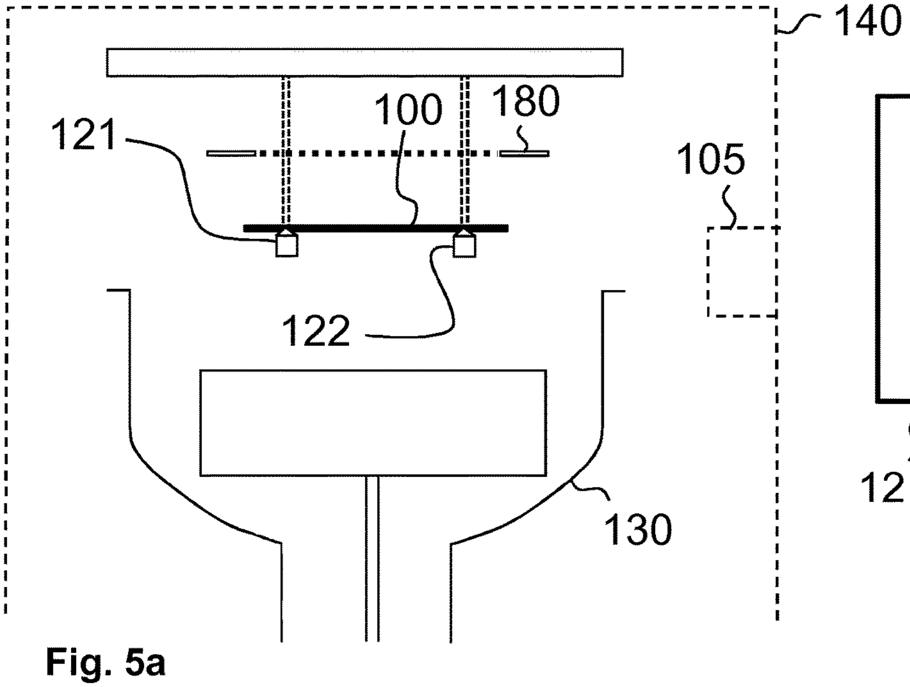
FIGS. 5*a* and 5*b* show supporting the substrate by the susceptor in certain embodiments.
Figure 5B:
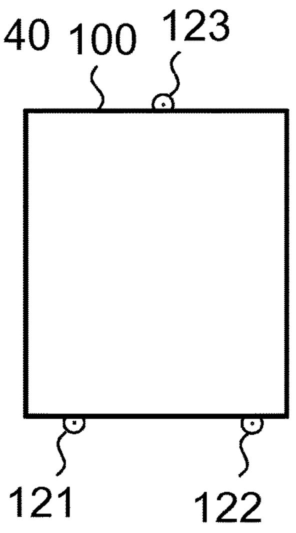

Now, turning to FIGS. 5*a* and 5*b* it is remembered that FIGS. 2*a* and 2*b* left the loading sequence in a phase in which the substrate 100 was held by the pins 121-123 of the susceptor 120. After the end effector 106 has been retracted the location of the parts involved is as shown in FIGS. 5*a* and 5*b*.

Figure 6A:
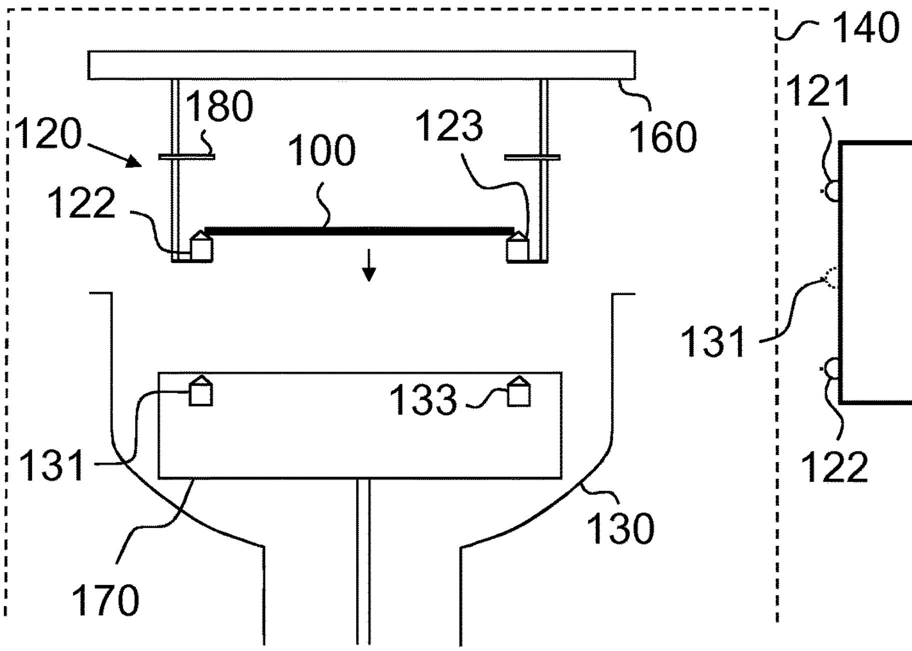
FIGS. 6*a* and 6*b* show another side view of the loading stage illustrated in FIGS. 5*a* and 5*b;*
Figure 6B:
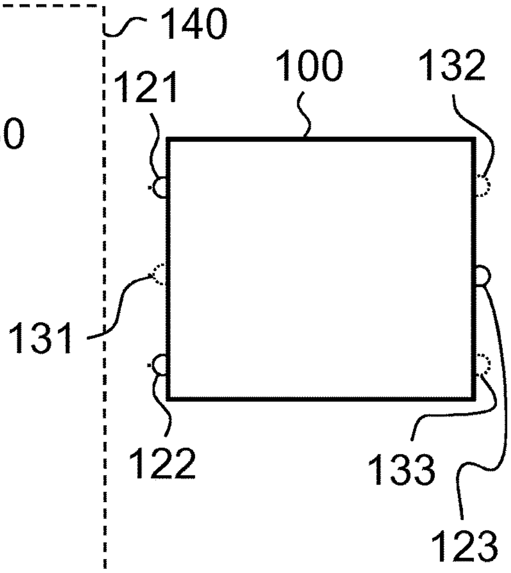

FIGS. 6*a* and 6*b* show the same phase in the loading sequence from a direction that is rotated clockwise by 90 degrees. The substrate 100 is supported by pins 121-123 when the lowering of the substrate 100 begins. The substrate 100 is lowered by a combined movement of the reaction chamber lid 160 and susceptor 120 towards the support part 170. The support part 170 comprises a corresponding pin interface having pins aligned with the edges of the substrate 100. As three pins are required to support the substrate 100 the pin interface of the support part 170 contains one pin 131 aligned with the edge that is supported by two susceptor pins and two pins 132, 133 aligned with the edge that is supported by one susceptor pin.

Figure 7A:
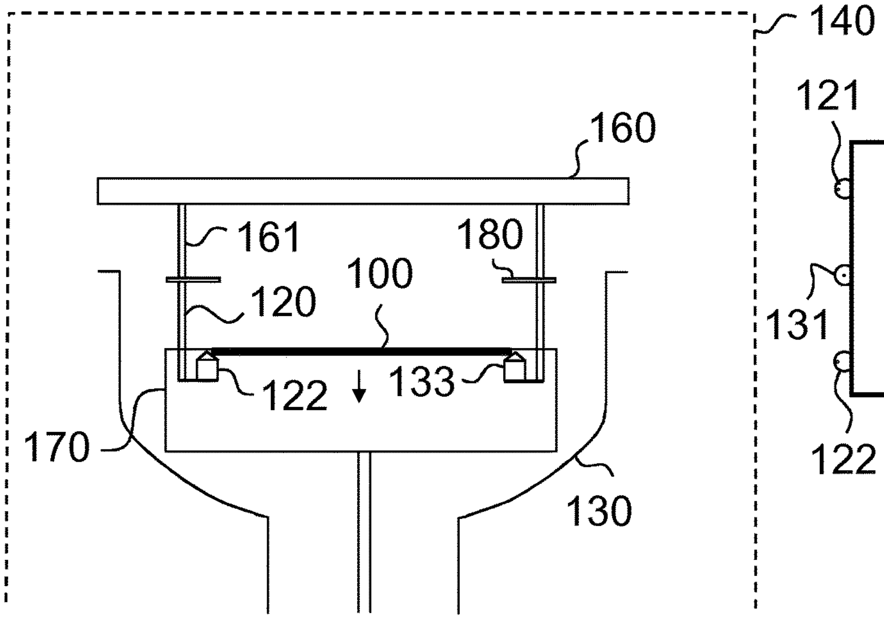
FIGS. 7*a* and 7*b* show bringing the substrate into contact with the support part in certain embodiments.
Figure 7B:
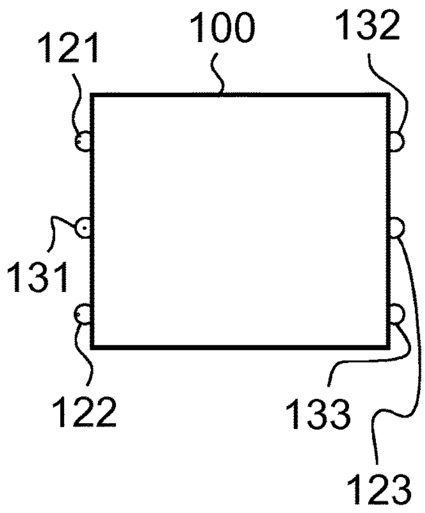

FIGS. 7*a* and 7*b* show bringing the substrate 100 into contact with the support part 170. In this phase the substrate 100 is lowered so much that it is touched by the pins 131-133. Now, the susceptor 120 together with the reaction chamber lid 160 is lowered further to detach the substrate 100 from the pins 121-123. The substrate thus lies in the processing position on the pins 131-133. The substrate 100 is supported by its edges only.

Figure 8A:
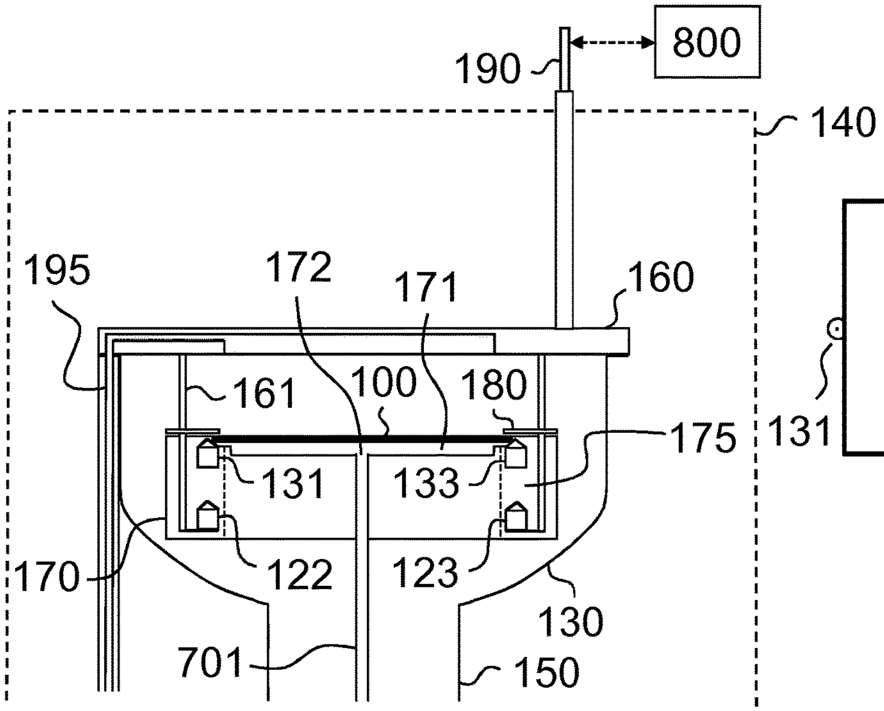
FIGS. 8*a* and 8*b* show detaching the substrate from the susceptor in certain embodiments.
Figure 8B:
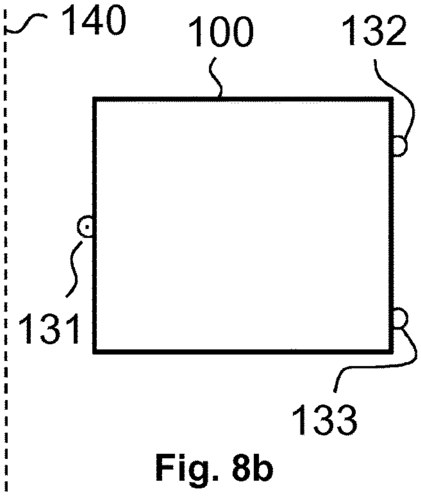

As depicted by FIGS. 8*a* and 8*b*, the lowering movement of the susceptor 120 and the lid 160 continues until the lid 160 touches its counter surface in the reaction chamber wall thereby sealing the reaction chamber 130. The support part comprises pockets 175 to accommodate the lowered susceptor 120 including the pins of the susceptor pin interface.

The movement of the lid 160 and other parts attached to it is effected by an elevator 190 coupled to the lid 160. The elevator 190 may be coupled to the lid 160 from the top as illustrated in FIG. 8*a*. The elevator is controlled by a control system 800. The control system 800 also controls other operation of the substrate processing apparatus.

It is appreciated that the apparatus can contain a plurality of in-feed lines along which chemicals can flow into the reaction chamber for substrate processing, for example ALD processing. FIG. 8*a* shows one chemical in-feed line 195 along which chemical(s) may flow into the reaction chamber 130 via the lid 160. In other embodiments, the place for chemicals to enter to the reaction chamber, is the side of the reaction chamber 130 wall. There may be parts for guiding the incoming chemical gas flow.

The support part 170 comprises the recessed area 171 that remains under the bottom face of the substrate 100. The recessed area 171 contains the fluid inlet 172 centrally located in the recessed area 171 to flow protective gas into the volume delimited by the substrate bottom face and the recessed area 171. The protective gas functions as a barrier preventing reactive chemicals from entering into the area below the substrate. This is discussed in more detail in connection with FIG. 10.

Figure 9:
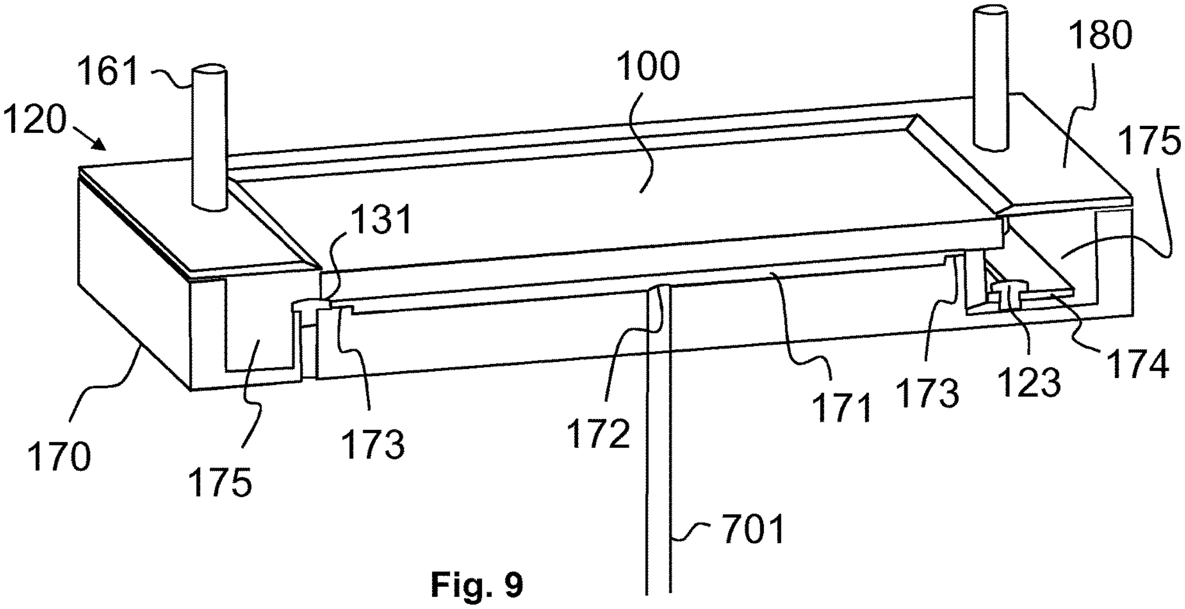
FIG. 9 shows a cross sectional view of the susceptor and support part in a substrate processing stage in certain embodiments.

FIG. 9 shows a cross sectional view of the susceptor 120 and support part 170 in a substrate processing stage in certain embodiments. The susceptor 120 has been lowered into inside of the support part 170, i.e. into the pockets 175. The pin 123 of the susceptor pin interface attached to part 174 is visible in the right hand side pocket.

The recessed area 171 extends almost over the whole area underneath the bottom face of the substrate 100. However, close to the edges of the bottom face the recessed area ends and the vertical distance between the bottom face and the support part 170 is reduced by a ridge 173 that surrounds the recessed area 171 below the boundary area of the bottom face. The flow rate of the protective gas flow is increased at the ridge area further reducing the risk of any undesired material ending up into the volume in between the bottom face of the surface 100 and the support part 170.

Figure 10:
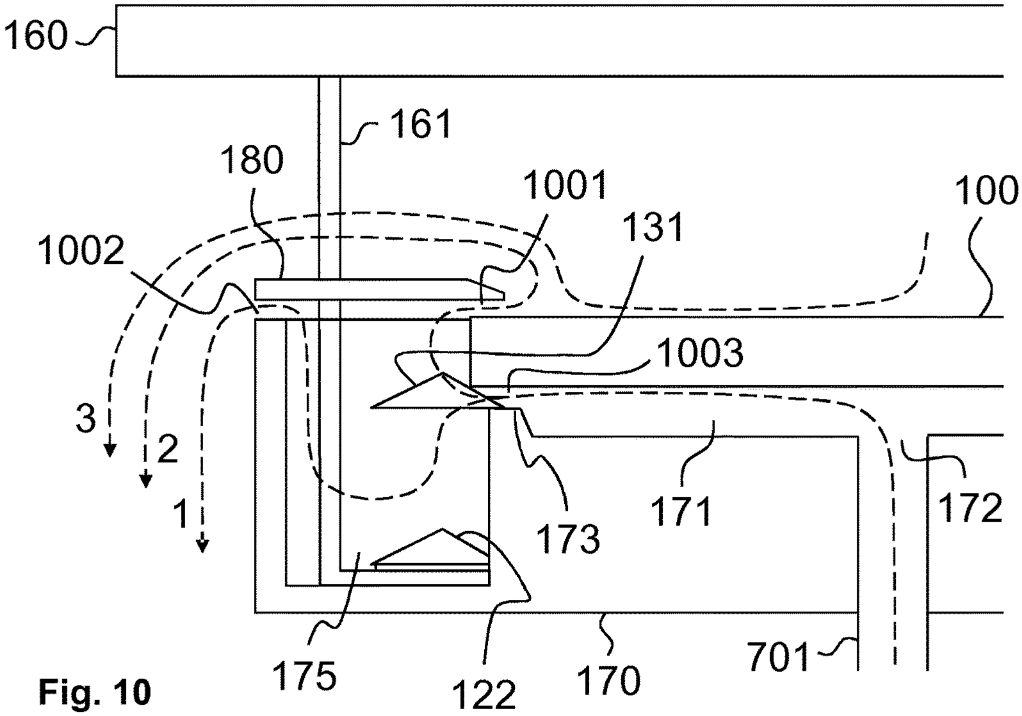
FIG. 10 shows flow directions of fluid in the substrate processing stage in certain embodiments.

FIG. 10 shows the positions of the different parts of the substrate processing apparatus in the substrate processing stage. In particular, the figure shows flow directions of fluid in the substrate processing stage in certain embodiments.

Process gases, such as precursor vapor in the ALD process approach the substrate surface (top surface) from the top of the surface, for example, from a showerhead in the lid 160. The desired reactions occur in the substrate surface.

Protective gas flowing along in-feed line 701 flows into the space (recessed area 171) in between the bottom face of the substrate 100 and the support part 170 via the inlet 172. The bottom face of the substrate is generally denoted as the backside of the substrate.

The following gaps are provided within the apparatus:

A first gap 1001 is provided between the frame part 180 and the substrate 100. The frame part 180 attached to the susceptor 120 and/or lid 160 has been lowered onto the substrate 100 leaving the first gap 1001 therebetween. The frame part 180 can have a slanted edge as shown in FIG. 10.

A second gap 1002 is provided between the frame part 180 (or bottom surface of the frame part 180) and the support part 170. The second gap can be provided by dimensioning of the parts so that when the frame part 180 attached to the susceptor 120 and/or lid 160 is lowered onto the substrate 100 also a gap in between the frame 180 and the support part border area is produced.

A third gap 1003 is provided between the ridge 173, or upper surface of the ridge 173, and the bottom face of the substrate 100. The third gap is provided by the same lowering movement as the first and second gaps 1001, 1002.

The gaps 1001-1003 in certain embodiments are vertical gaps, i.e., gaps that limit vertical movement but allow horizontal flow to pass through.

Three flow paths of fluid can be recognized. The first flow path (route 1) extends from the inlet 172 via the third gap 1003 into the pocket 175 and therefrom via the second gap 1002 to exhaust which is located at the bottom of the reaction chamber 130. The second flow path (route 2) extends from the inlet 172 via the third gap 1003 into the pocket 175 and therefrom via the first gap 1001 onto the top face of the substrate 100. The third flow path (route 3) is for the process gases and protecting gas from above the top face of the substrate 100 going round the frame part 180 and support part 170 to the exhaust. The flow of the protective gas via the first gap causes a counter pressure that prevents at least one of the reactive chemical(s) that is present on the top face, from entering into the first gap 1001. The flow direction in the first gap 1001 is from the pocket 175 towards the top face/surface of the substrate 100. The flow direction in the second gap 1002 is from the pocket 175 towards exhaust. Accordingly, there is only inert protective gas in the volumes that face the bottom face (backside) of the substrate 100 and the side faces of the substrate. The bottom and side faces are thereby protected against material growth on these faces/surfaces. In certain embodiments, the described flow via the gap 1001 is altered to stop, or the flow is at least partly reverted to flow into the pocket (or cavity) and directly via the second gap 1002 to exhaust. In such a way certain special substrate edge coating option(s) may be enabled.

In certain other embodiments, there are additional hole(s) at the bottom of pocket 175 (not shown), where the gas is flowing away from inlet 172 to an exhaust. In certain embodiments, the gas flow entering the pocket 175 via the first gap 1001 flows into the exhaust via the said additional hole(s).

Figure 11:
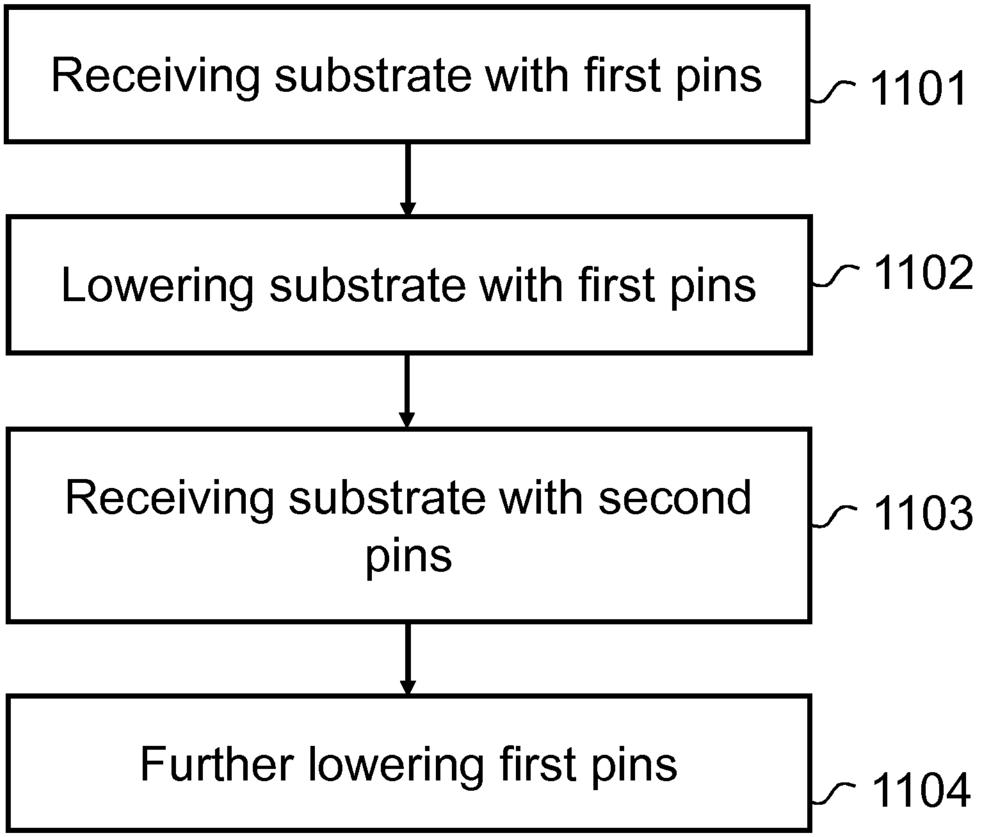
FIG. 11 shows a flow chart of a method according to certain embodiments.

FIG. 11 shows a flow chart of a method according to certain embodiments. In step 1101, the susceptor receives the substrate from a loader. In step 1102, the substrate is supported with first pins and lowered. In step 1103, the substrate is received by second pins. Finally, in step 1104, the first pins are further lowered detaching them from the substrate. In addition to the described loading sequence, the method in certain embodiments, comprises causing a protective fluid flow into a space in between the substrate and a support part. In certain embodiments, the frame 180 is lowered close to the substrate or to at least partial contact to the top (face) surface of the substrate.

A substrate coating process typically consists of loading a substrate into a reaction chamber (e.g., with a process as shown in the FIG. 11), optionally stabilizing the substrate temperature with such means as gas flows via gas or chemical inlets, optionally etching of the substrate with such means as gas flows via said gas or chemical inlets, or by plasma, or by photon (such as infrared (IR), or ultraviolet (UV), or visible UV) radiation, depositing required layer thickness on the substrate with a selected number of ALD deposition cycles, and removing or lifting the substrate away from the reaction chamber with an inverse order compared to said loading.

FIGS. 12*a*-16*b* show further embodiments in which a substrate is loaded into a reaction chamber of a substrate processing apparatus during a loading sequence and/or is processed therein. The embodiments shown include a vertically movable reaction chamber 230 which may be lowered for loading and unloading of substrate(s). An example of a vertically movable reaction chamber is shown in PCT publication WO 2018/146370 A1. For the sake of readability, all reference numbers are not presented in every figure. A general reference is made to the explanation described in connection with FIGS. 1-10.

Figure 12A:
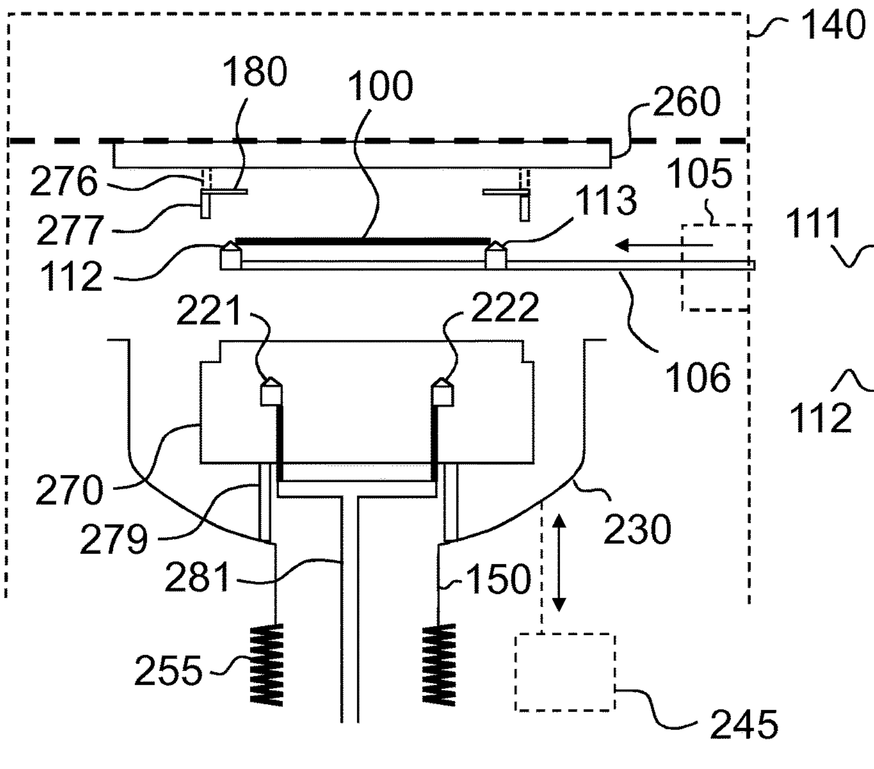
FIGS. 12*a* and 12*b* show supporting a substrate by an end effector during a loading stage in certain further embodiments.
Figure 12B:
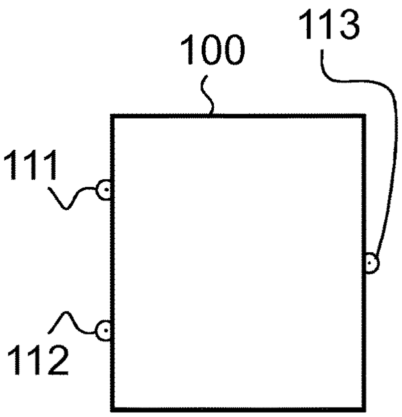

FIGS. 12*a* and 12*b* show supporting a substrate 100 by an end effector 106 during a loading stage.

As described in the preceding, the substrate 100 may a rectangular substrate having a top face and a bottom face. The top face and bottom face are connected by sides or side faces. The side faces comprise a front face, a back face, a right face, and a left face. The faces may be determined in accordance with the loading direction in which the end effector 106 loads the substrate 100 into the reaction chamber 230. The lines or borders where the top or bottom faces meet the side faces are defined as edges. In certain embodiments, the substrate is a mask. In certain embodiments, the thickness of the substrate is 4 mm or more. In certain embodiments, the substrate is made of quartz.

The end effector 106 moves the substrate 100 by a horizontal movement via a load lock 105 into the reaction chamber 230. The horizontal arrow in FIG. 12*a* illustrates the horizontal movement of the end effector 106.

FIG. 12*a* shows the reaction chamber 230 in an open position where the reaction chamber has been lowered apart from a reaction chamber lid 260 forming a loading opening in between the (lowered) reaction chamber 230 and the reaction chamber lid 260. The lid 260 remains fixed to its level. As described in WO 2018/146370 A1, the apparatus comprises a moving element 255 connected to the reaction chamber 230. The moving element 255 allows the reaction chamber 230 to move vertically between an upper position and the lowered position. The moving element 255 may be a flexure structure. It may be a tube-like elongated structure whose length is adjustable. The moving element 255 may be a deformable component. The moving element 255 shown in FIG. 12*a* is a bellows, in particular a vacuum bellows, allowing fluid to pass through in a vertical direction, but having gastight side walls. The moving element 255 may form part of an exhaust line 150 below the reaction chamber 230 as shown in FIG. 12 *a*. The moving element 255 may be positioned in its entirety inside of walls of an outer chamber 140 in vacuum.

The actual movement of the reaction chamber 230 may be driven by an actuator (actuating element) or by the moving element 255 itself. The embodiment in FIG. 12*a* shows an actuator 245 positioned on the outside of the outer chamber 140. The actuator 245 applies force to the reaction chamber 230 so that the reaction chamber moves as allowed by the moving element 255. The actuator 245 shown in FIG. 12*a* comprises a force transmission member, such as a shaft or rod, which extends through an outer chamber feedthrough into an intermediate space between the outer chamber 140 and reaction chamber 230. The force transmission member further contacts the reaction chamber 230 enabling movement of the reaction chamber 230 as allowed by the moving element 255. The moving element 255 has a contracted shape as shown in FIG. 12*a* and an extended shape (as will be shown later in connection with FIG. 16*a*), and it allows vertical movement of the reaction chamber 230 between positions defined by these shapes.

In other embodiments, the placement, form and operation of the actuating element may deviate from the ones shown in FIG. 12*a* (and 16*a*). The placement of the actuating element depends on the implementation. In certain embodiments, the actuating element is positioned on the outside of the outer chamber 140. In certain embodiments, the actuating element is positioned within the outer chamber 140, but on the outside of the reaction chamber 230. In certain embodiments, the actuating element is positioned within the exhaust line 150. Depending on the implementation the apparatus can comprise a plurality of actuating elements.

In certain embodiment, the actuating element is omitted altogether. In one such an embodiment, the moving element 255 as such moves the reaction chamber 230 without an external actuator (external here meaning external to the moving element). The moving may be implemented due to radiation or changes in temperature, for example. In one such an alternative embodiment the moving element 255 is formed of shape-memory alloy (smart metal). In such an embodiment, the moving element 255 in practice is a kind of actuator in itself which moves the reaction chamber 230 between vertical positions.

As described, the apparatus is configured to form a loading opening into the reaction chamber 230 by downward movement of the reaction chamber 230 (although, in other embodiments, the reaction chamber wall may be provided with a door or hatch to create a loading opening). The reaction chamber 230 may detach from the lid 260 upon the downward movement. In other embodiments, an upper stationary part from which the reaction chamber 230 detaches by downward movement, is a part other than the lid 260, for example a plasma in-feed tube or photon-excitation in-feed tube positioned in the place of the lid 260. Regardless of the upper stationary part being a lid or another part, the upper stationary part may be a part providing fluid in-feed into the reaction chamber 230.

The end effector 106 comprises support pins 111-113 to support (carry) the substrate. Three pins are required to support the substrate 100. The pins support the substrate 100 at the edges only. In the presented example, there are two pins 111,112 supporting the substrate 100 at the edge connecting the bottom face and front face of the substrate and one pin 113 supporting the substrate 100 at the edge connecting the bottom face and back face of the substrate. This is illustrated in the top view shown in FIG. 12*b*.

In certain embodiments, the substrate processing apparatus comprises a pin lifter 281 that has a pin interface. The pin lifter 281 is vertically movable. In certain embodiments, the pin lifter 281 is actuated via the exhaust line 150. In certain embodiments, the vertical movement of the pin lifter 281 may be actuated by an arm or similar extending vertically from the exhaust line 150 to the reaction chamber 230.

In the example shown in FIG. 12*a*, the substrate processing apparatus further comprises a frame (or frame part) 180. The frame part 180 is positioned directly on top of the substrate 100 so that it frames the border areas of the underlying substrate 100. The frame part 180 is attached to the reaction chamber lid 260 by a connecting element 276.

The substrate processing apparatus further comprises a support part (or base part) 270. In certain embodiments, the support part 270 is attached to the reaction chamber 230 or exhaust line 150 by a connecting element 279. The support part 270 is configured to accommodate the pin lifter 281 or at least part of the pin lifter 281, and any or at least some of the features presented earlier for the support part 170, such as the protective gas flow via inlet 701 (not shown).

The apparatus comprises a protective fluid in-feed line for flowing protective fluid into the support part 270. The in-feed line may be routed via and/or inside the exhaust line 150 positioned on the bottom of the reaction chamber 230. A similar configuration that has been shown in the preceding in connection with FIGS. 1-10 may be provided. The in-feed line may be adopted to heat the incoming gas, or heated gas may be guided into it.

The reaction chamber 230 may be surrounded by a further chamber, the outer chamber 140 which may be a vacuum chamber (or further vacuum chamber because the reaction chamber 230 also is a vacuum chamber).

Figure 13A:
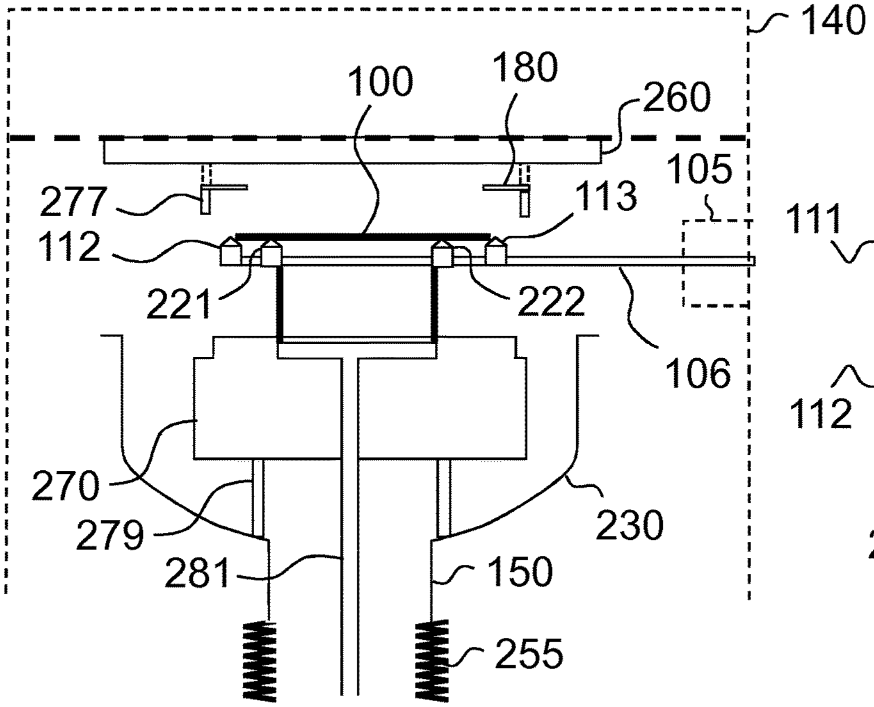
FIGS. 13*a* and 13*b* show receiving the substrate by a pin lifter in certain further embodiments.
Figure 13B:
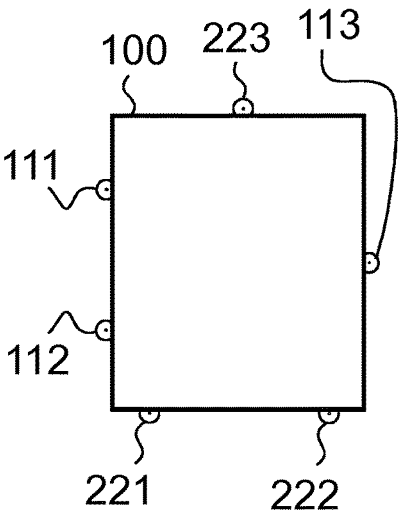
Figure 14A:
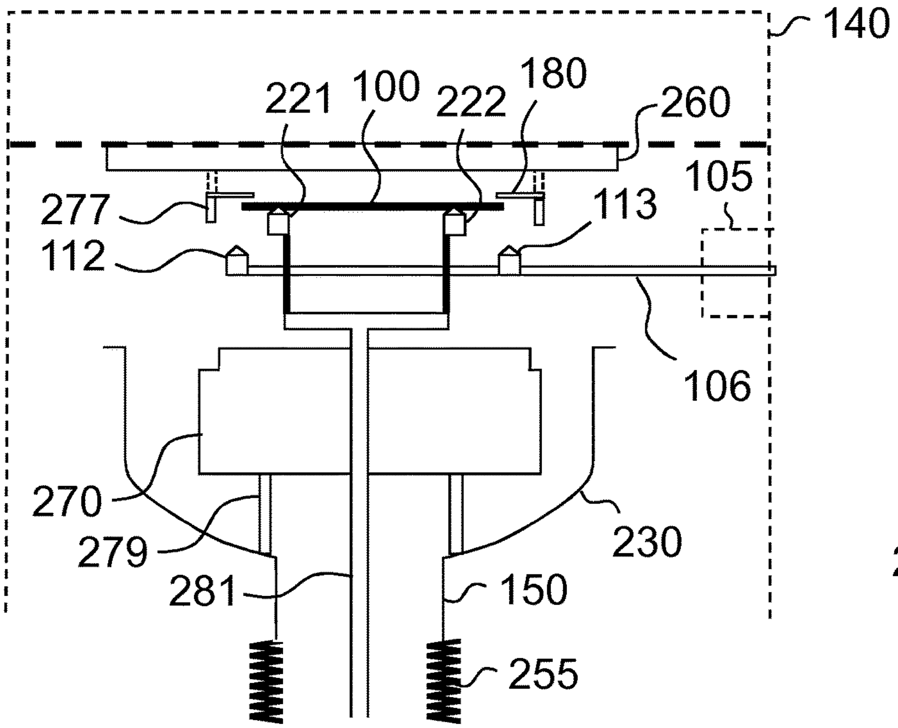
FIGS. 14*a* and 14*b* show lifting the substrate into a processing position in certain further embodiments.
Figure 14B:
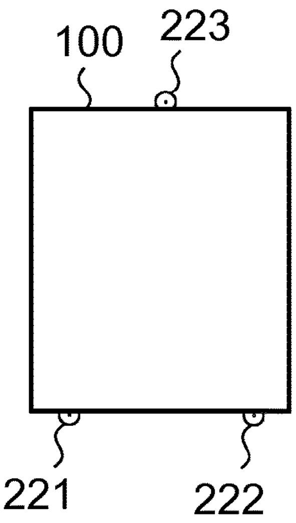
Figure 15A:
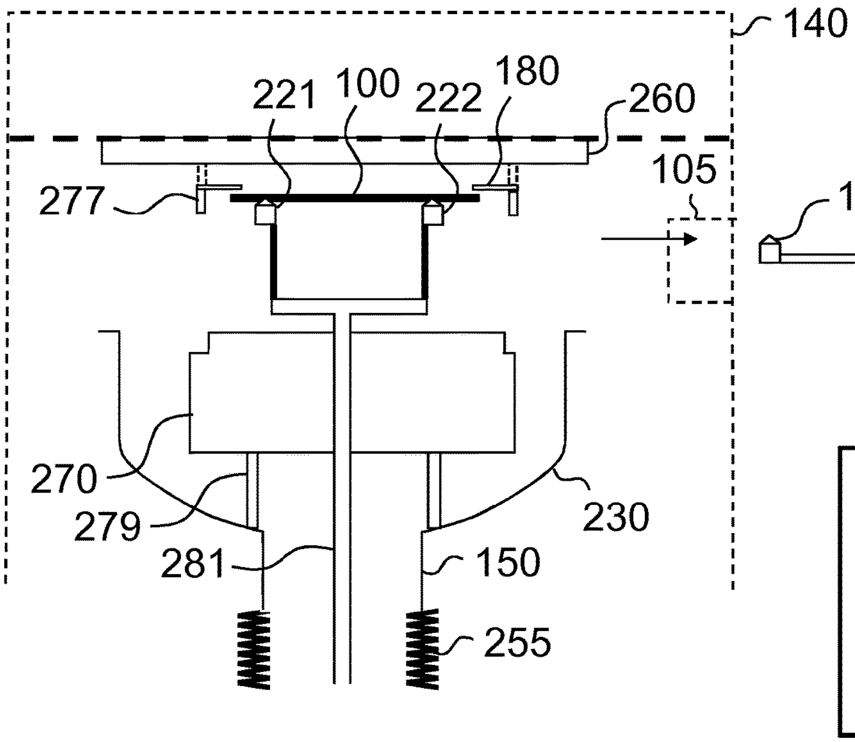
FIGS. 15*a* and 15*b* show retracting the end effector in certain further embodiments.
Figure 15B:
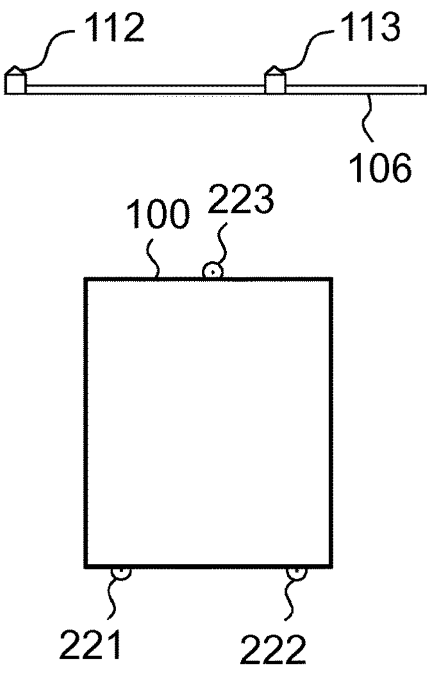

FIG. 12*a* shows the horizontal loader (end effector) 106 supporting the substrate 100 centrally located in the reaction chamber 230. Now, as shown by FIGS. 13*a* and 13*b*, the pin lifter 281 with its pin interface is lifted so that the pins of the pin lifter pin interface contact the edges of the substrate 100. In this phase the substrate is supported by both the end effector 106 and the pin lifter 281. The substrate 100 is thereafter lifted upwards with the pin interface of the pin lifter 281 to detach the substrate 100 from the pins of the end effector 106 ending up with the position shown in FIGS. 14*a* and 14*b*. The end effector 106 is retracted from the reaction chamber 130 via the load lock 105 as depicted by the horizontal arrow in FIG. 15*a*.

Three pin lifter pins are required to support the substrate 100. The pins support the substrate 100 at the edges only. In the presented example, there are two pins 221,222 supporting the substrate 100 at the edge connecting the bottom face and left face of the substrate and one pin 223 supporting the substrate 100 at the edge connecting the bottom face and right face of the substrate 100. This is shown in the top view shown in FIG. 14*b*.

Figure 16A:
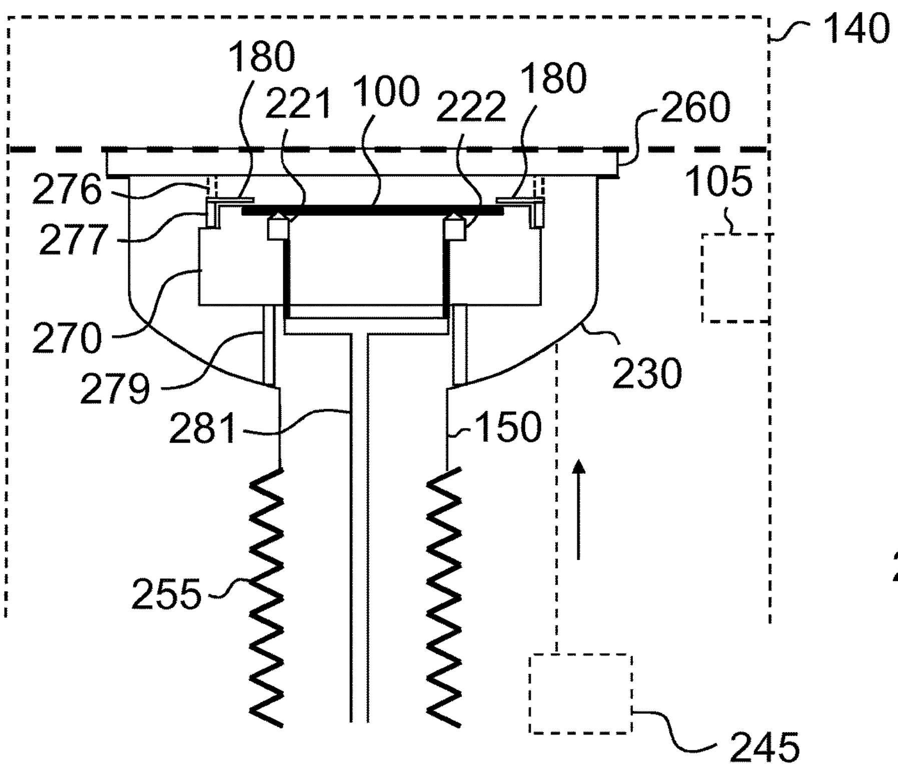
FIGS. 16*a* and 16*b* show raising the reaction chamber in certain further embodiments.
Figure 16B:
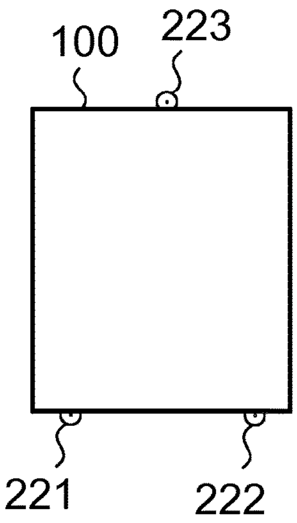

Finally, the reaction chamber 230 is lifted against the lid 260 (or another top attachment part as the case may be) by the actuator 245 as shown by FIGS. 16*a* and 16*b*. The frame part 180 attached to the reaction chamber lid 260 is in the position directly on top of the substrate 100 so that the frame part 180 frames the border areas of the underlying substrate 100. In certain embodiments, there is a small vertical gap in between frame part 180 and the top surface (top face) of the substrate 100.

Lifting the reaction chamber 230 also causes lifting the support part 270 (that is attached to the reaction chamber 230) to an upper position close to the substrate 100 in which position the support part 270 serves as means for providing the substrate with a protective gas flow for preventing backside growth. The frame part 180 is fitted against the support part 270 by a suitable counterpart, for example by a downwards protruding part 277 fitted against a corresponding cut-out in the support part 270.

As mentioned, a similar configuration that has been shown in the preceding in connection with FIGS. 1-10 may be provided to prevent backside growth on the substrate. Accordingly, the support part 270 comprises a recessed area (corresponding to the recessed area 171) that remains under the bottom face of the substrate. The recessed area contains a fluid inlet (corresponding to the fluid inlet 172) to flow protective gas into a volume delimited by the substrate bottom face and the recessed area. The support part 270 further comprises pockets (corresponding to the pockets 175) to accommodate the pin lifter 281 or at least part of the pin lifter 281. Similar gaps and gas routes are provided as explained in connection with FIGS. 1-10.

It is appreciated that the apparatus can contain a plurality of in-feed lines along which chemicals can flow into the reaction chamber for substrate processing, for example ALD processing. For example, chemical(s) may flow into the reaction chamber 230 through the lid 260 or similar and/or through a side wall of the reaction chamber 230. In certain embodiments, it is possible to feed in the protective gas via the lid 260, inside fixed structures like the connecting element 276 or downwards protruding part 277, or via other gas pipes extending downwards from the lid 260 to the support part 270 when it is at its upper position. In certain embodiments, a gas route for protective gas is provided via an edge of the reaction chamber 230 and through the connecting element 279.

Process gases, such as precursor vapor in the ALD process, approach the substrate surface (top surface) from the top of the surface, for example, from a showerhead in the lid 260. The desired reactions occur in the substrate surface. A benefit is that joints in gas lines may be omitted.

Embodiments shown in FIGS. 1-10 show substrate loading into the reaction chamber by taking advantage of the vertically movable lid, whereas the embodiments shown in FIGS. 12*a*-16*b* show substrate loading by lowering and lifting the reaction chamber. FIGS. 17*a*-18*b* show embodiments which take advantage of both the vertically movable lid and the lowerable and liftable reaction chamber.

Figure 17A:
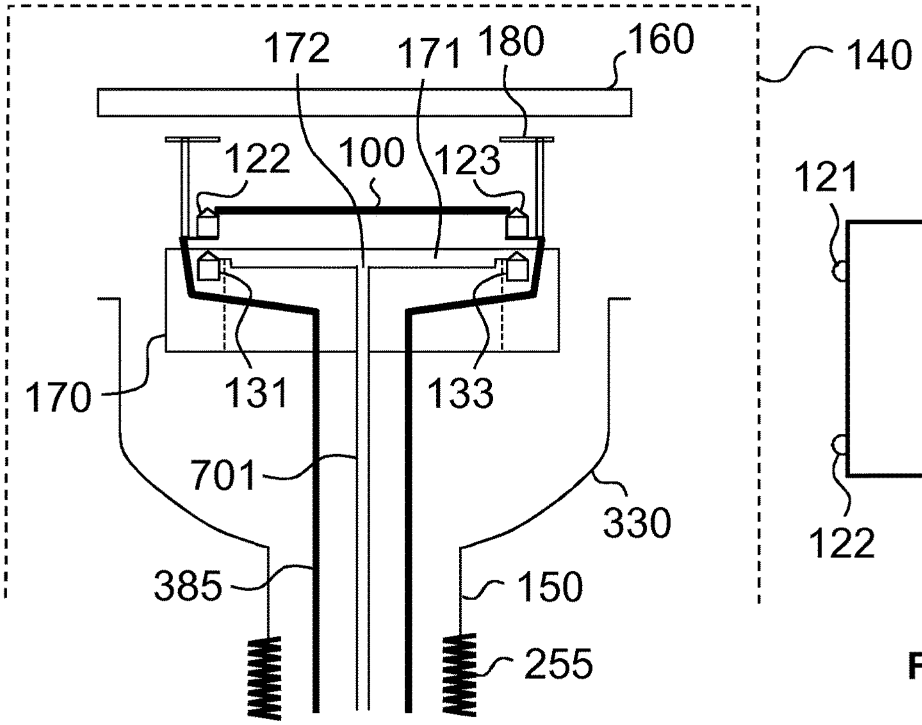
FIGS. 17*a* and 17*b* show supporting the substrate by susceptor pins in yet further embodiments.

FIG. 17*a* shows a loading scenario similar to that shown in embodiments of FIGS. 1-10 except that the support part 170 and the combination of the frame part 180 and susceptor are separate from the lid 160 (not attached to the lid 160). Furthermore, the reaction chamber 330 is similar to the reaction chamber 230 described in the preceding except that the support part 170 (or 270 in embodiments shown in FIGS. 12*a*-16*b*) is not fixed to the reaction chamber 330 by the connecting element(s) 279. The support part 170 is attached to the exhaust line 150 and is stationary. The combination of the frame part 180 and susceptor on the other hand is vertically movable by an actuator arm (or lifter) 385 attached to the exhaust line 150.

Figure 17B:
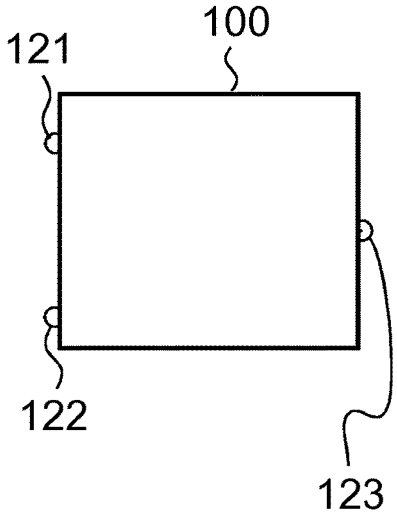

FIGS. 17*a* and 17*b* show a situation in which the initial loading steps involving the end effector have already been performed, and the substrate 100 lies on the susceptor pin interface. Accordingly, the substrate 100 is in a loading stage corresponding to the loading stage initially shown in FIGS. 5*a*-6*b*. The combined frame part 180 and susceptor has been lifted by the actuator arm 385 to above the support part 170, and the reaction chamber 330 has been lowered to a lowered position.

Three pins are required to support the substrate 100. The pins support the substrate 100 at the edges only. In the presented example, there are two pins 121,122 supporting the substrate 100 at the edge connecting the bottom face and left face of the substrate and one pin 123 supporting the substrate 100 at the edge connecting the bottom face and right face of the substrate. This is illustrated in the top view shown in FIG. 17*b*.

The substrate 100 is supported by pins 121-123 when the lowering of the substrate 100 begins. The substrate 100 is lowered by lowering the combined frame part 180 and susceptor by the actuator arm 385 towards the support part 170. The support part 170 comprises a corresponding pin interface having pins aligned with the edges of the substrate 100. As three pins are required to support the substrate 100 the pin interface of the support part 170 contains one pin 131 aligned with the edge that is supported by two susceptor pins and two pins 132, 133 aligned with the edge that is supported by one susceptor pin.

The substrate 100 is brought into contact with the support part 170. In this phase the substrate 100 is lowered so much that it is touched by the pins 131-133. Now, the susceptor together with the frame part 180 is lowered further to detach the substrate 100 from the pins 121-123. The substrate thus lies in the processing position on the pins 131-133. The substrate 100 is supported by its edges only.

Figure 18A:
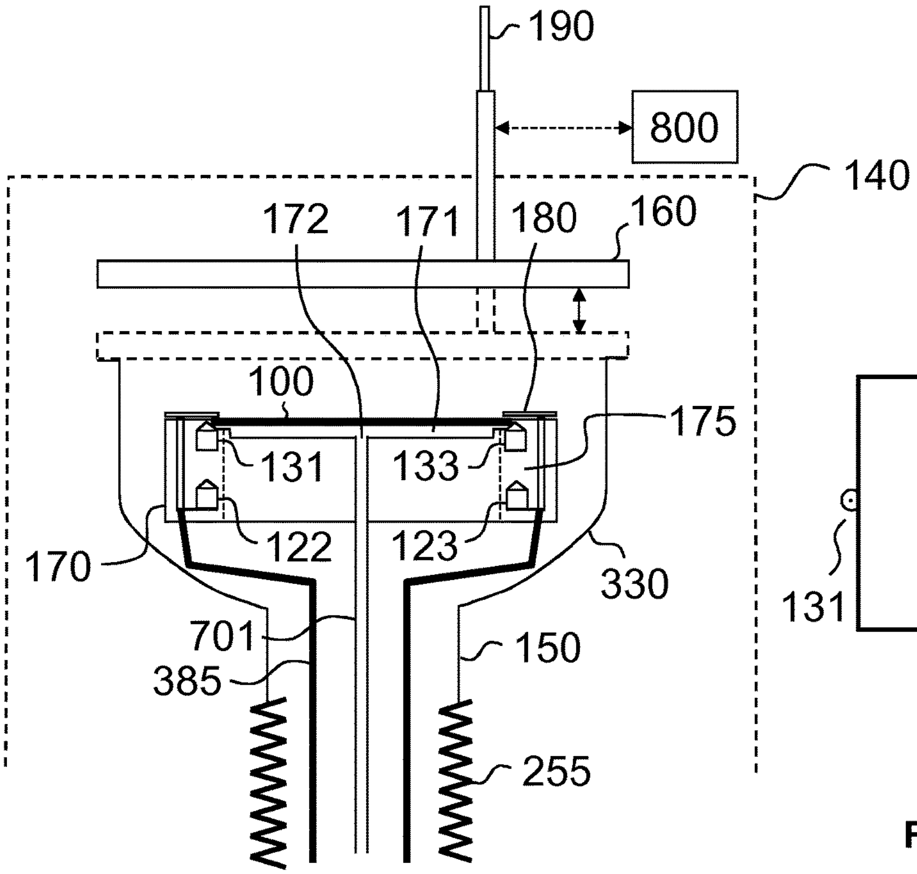
FIGS. 18*a* and 18*b* show bringing the substrate into contact with a support part in yet further embodiments.
Figure 18B:
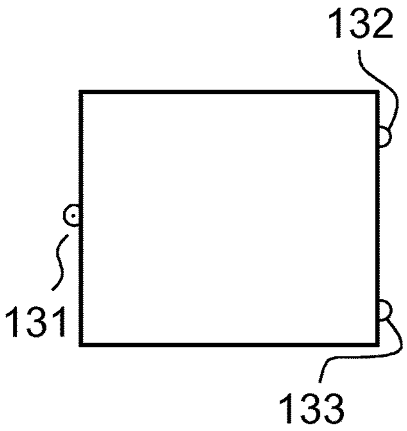

As depicted by FIGS. 18*a* and 18*b*, the lowering movement of the susceptor and the frame part 120 continues until the susceptor is in its lowest position and the frame part close to the substrate leaving only a small vertical gap in between frame part 180 and the top surface (top face) of the substrate 100, or closing it completely in certain embodiments. The support part 170 comprises pockets 175 to accommodate the lowered susceptor including the pins of the susceptor pin interface.

The apparatus shown in FIGS. 17*a*-18*b* has the vertically movable lid 160. As mentioned, the movement of the susceptor and the frame part 180 is effected by the actuator arm 385. Furthermore, the reaction chamber lid 160 is lowered by the elevator 190 (see also FIG. 8*a*) to seal the reaction chamber 330 against the lid 160.

In other embodiments, in the place of lid 160 is (or the lid 160 is formed as) an open ring or part providing space for a plasma in-feed tube or photon-excitation in-feed tube, for example.

It is appreciated that the apparatus can contain a plurality of in-feed lines along which chemicals can flow into the reaction chamber for substrate processing, for example ALD processing. For example, chemical(s) may flow into the reaction chamber 330 through the lid 160 or similar and/or through a side wall of the reaction chamber 330.

Process gases, such as precursor vapor in the ALD process approach the substrate surface (top surface) from the top of the surface, for example, from a showerhead in the lid 160. The desired reactions occur in the substrate surface.

A similar configuration that has been shown in the preceding in connection with FIGS. 1-10 may be provided to prevent backside growth on the substrate. Similar gaps and gas routes are provided as explained in connection with FIGS. 1-10.

Figure 19:
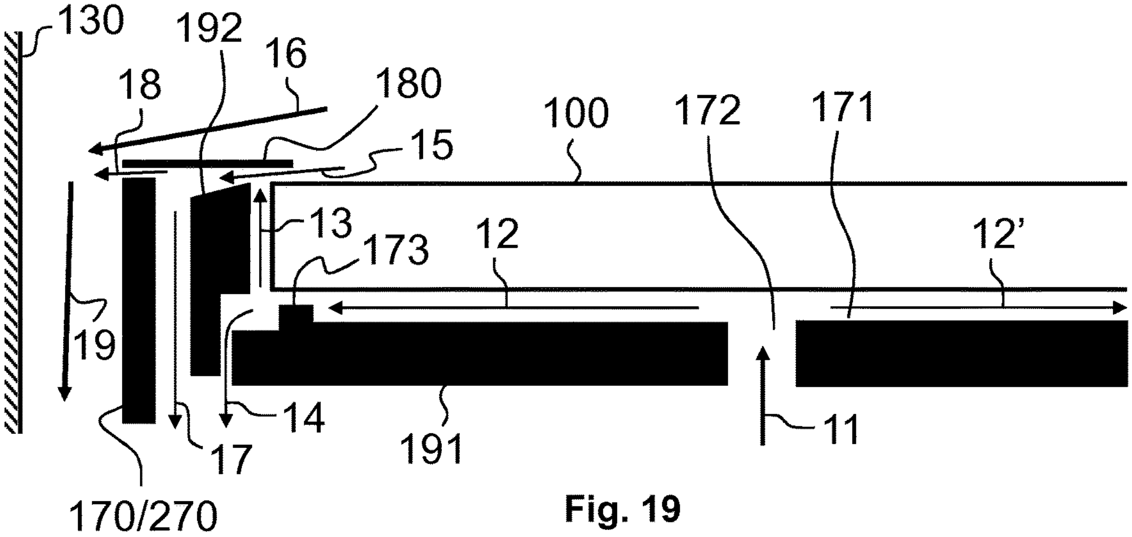
FIGS. 19, 20, and 21 show gas routes in certain embodiments.
Figure 22:
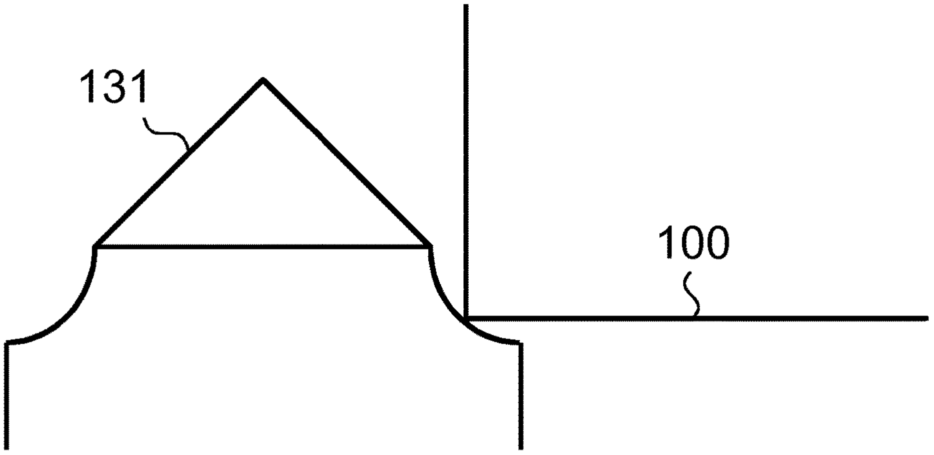
FIG. 22 shows certain details of a support pin in certain embodiments.
Figure 23:
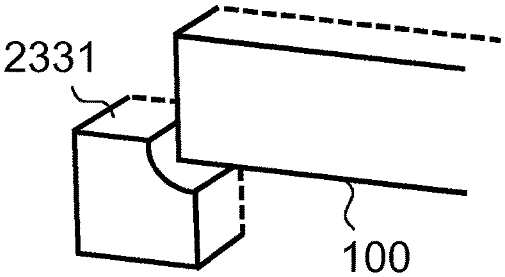
FIG. 23 shows a further supporting element in certain embodiments.

FIG. 19 shows certain alternative gas routes within the support part 170 (or 270). The support pins or similar supporting elements as shown later in FIGS. 22 and 23 are not shown in this cross section. As to the general structure and operation of the support part 170/270 a reference is made to FIGS. 9-10 and their description. The recessed area 171 extends almost over the whole area underneath the bottom face of the substrate 100. However, close to the edges of the bottom face the recessed area ends and the vertical distance between the bottom face and a background plate (substrate holder) 191 of the support part 170 is reduced by the ridge 173 that surrounds the recessed area 171 below the boundary area of the bottom face.

Protective gas flows into the space (recessed area 171) in between the bottom face of the substrate 100 and the background plate 191 via the inlet 172 as depicted by arrow 11. The protective flow spreads underneath the substrate 100 as depicted by arrows 12 and 12'. After having passed the ridge 173, the protective flow meets a side part 192 extending at the side of the substrate 100. The side part 192 divides the flow into a flow 13 and flow 14. The flow 13 that travels upwards along a gap formed in between the side part 192 and the side face of substrate 100. The flow 14 that travels in between the side part 192 and the background plate 191 to a pump line. The flow 13 prevents an undesired process chemical flow (as depicted by arrow 15) that may enter the gap in between the substrate 100 and the frame part 180 (from above the top face of the substrate) from entering the gap in between the side part 192 and the side face of substrate 100. Instead, flow 13 pushes the undesired process or residue chemical flow to a gas route that passes above the side part 192. Growth on the side face of substrate 100 is thus prevented. The flow on this route is divided into a flow 17 and flow 18. The flow 17 travels in between the side part 192 and a side wall of the support part 170/270 to a pump line. The flow 18 enters the gap in between the frame part 180 and the sidewall of the support part 170/270. Subsequently, the flow 18 joins a flow 16 coming from above the substrate top face and passing above the frame part 180. The combined flow continues as a downward flow 19 in between the support part 170/270 and the side wall of reaction chamber 130 (or 230/330) towards the exhaust line 150.

Figure 20:
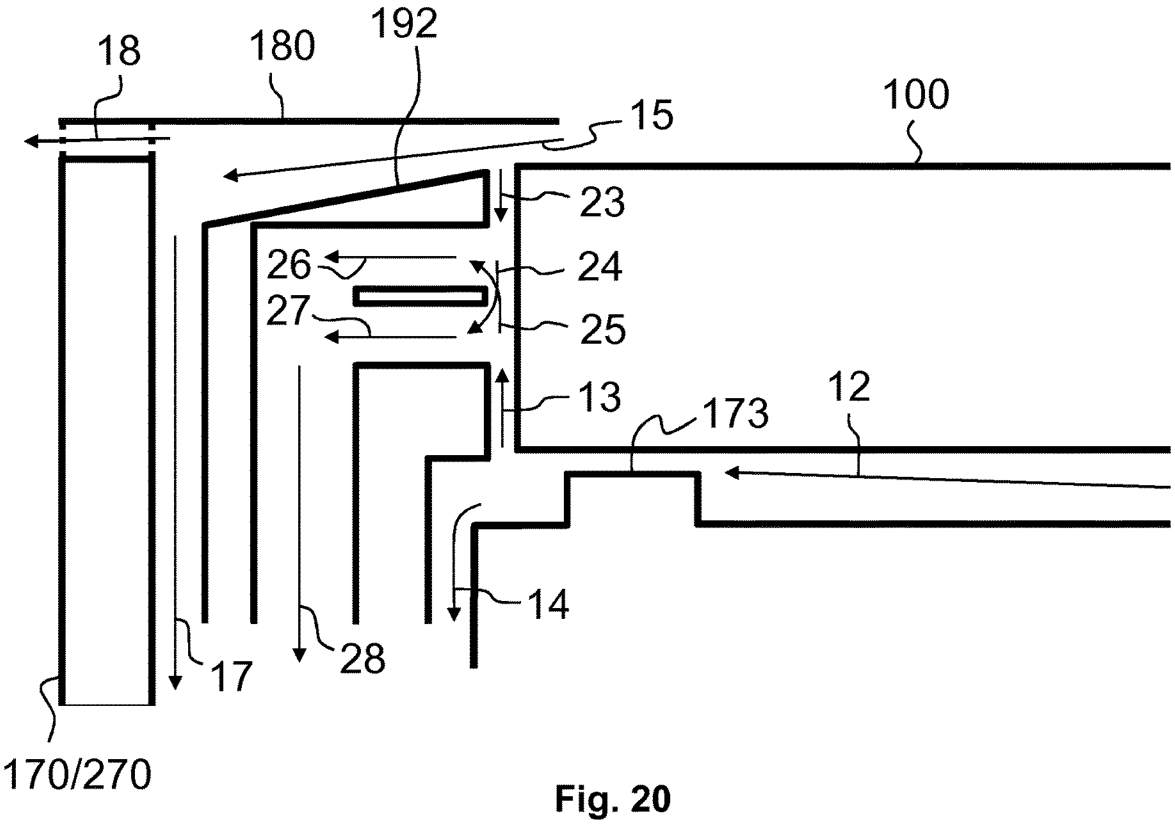

FIG. 20 shows a modification of the embodiment shown in FIG. 19 comprising flow channels within the part 192. The support pins or similar supporting elements as shown later in FIGS. 22 and 23 are not shown in this cross section. The part 192 comprises an upper flow channel 26 and a lower flow channel 27 having their respective mouths facing the side face of the substrate 100. After having travelled a certain distance within the part 192 the flow channels 26 and 27 join and form a combined flow channel 28 that travels downwards to a pump line. The flow 13 enters the lower flow channel 27. A flow 23 divided from flow 15 and which travels downwards in between the side face of substrate 100 and part 192 enters the upper flow channel 26. The flow 23 may also enter the lower flow channel 27 and the flow 13 the upper flow channel 26 as depicted by respective arrows 24 and 25. Material growth on the backside of the substrate 100 is prevented. The gap in between the frame part 180 and the side wall of the support part 170/270 in FIGS. 19 and 20 is non-existing or optional in certain embodiments. In such embodiments, the flow under the frame part 180 travels only to the pump line without mixing with flow 19 in the reaction chamber. Such divided gas flows 26 and 27 can be implemented with the one opening, or with multiple gaps.

Figure 21:
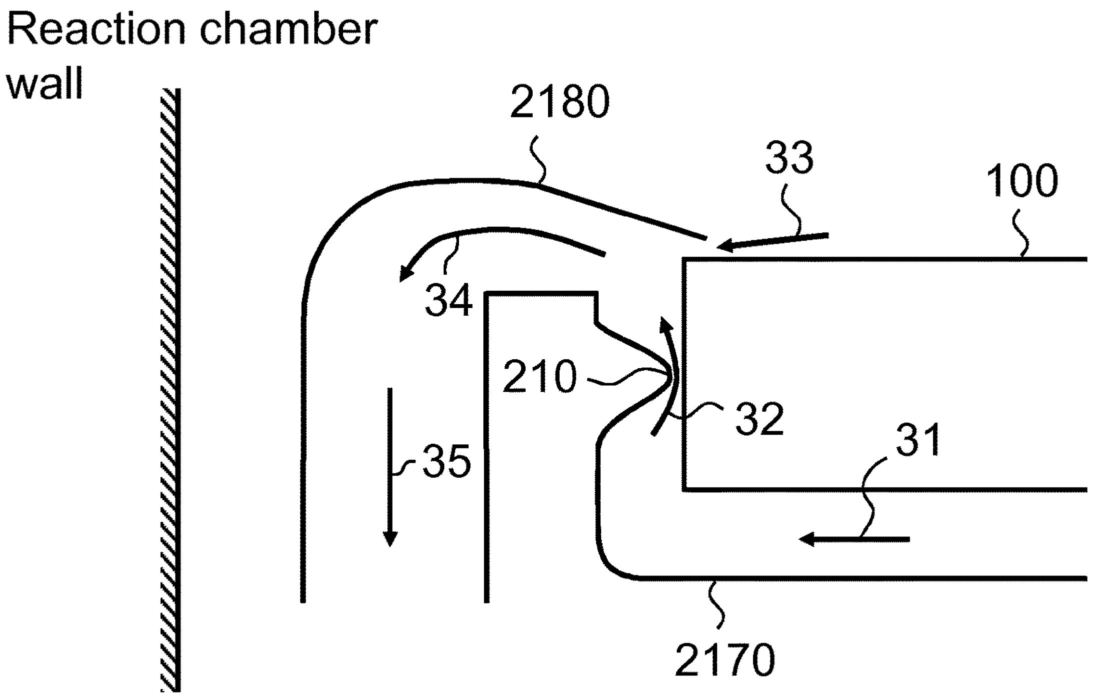

FIG. 21 shows a yet further embodiment. In this embodiment the background plate (substrate holder) 2170 takes a turn and covers also the side face of the substrate 100. The support pins or similar supporting elements as shown later in FIGS. 22 and 23 are not shown in this cross section. There is an ejector spot (a narrow place) 210 at the side of the substrate 100. The ejector spot 210 is arranged so that the channel width in between the side face of the substrate 100 and the turned background plate 2170 is reduced at the point of the ejector spot and then again increased after the ejector spot 210. The ejector spot 210 thus provides for a place in which the protective gas flow velocity is increased preventing a flow towards the opposite direction. The protective flow entered in between the bottom face of the substrate 100 and the background plate 2170 spreads sideways as depicted by arrow 31. The flow then turns over the substrate edge into an upward direction and passes the ejector spot 210 at an increased velocity. Downstream of the ejector spot 210 the flow meets a flow 33 that is coming from the direction of the substrate top face via the gap in between the frame part 2180 and the substrate 100. The frame part 2180 is formed so that the combined flow 34 experiences a flow channel that is increasing in its volume. Finally, the flow 34 turns downwards forming a downward flow 35 that travels to a pump line. The flow 35 is not mixed in the reaction chamber with a flow that travels on the other side of the frame part 2180 in between the frame part 2180 and the reaction chamber wall.

FIG. 22 shows certain details of a support pin in certain embodiments. As mentioned in the preceding, the end profile of the pins may be e.g. conical. FIG. 22 shows a conical top portion of the pin 131 followed by an inwardly recessed curved shape that receives the edge of the substrate 100 at an optimal angle.

Certain example embodiments have been described in the preceding with reference to FIGS. 1 to 22. Next certain alternative or further implementations are listed as follows:

- the frame part 180 may be omitted in certain embodiments, but if used an option is to use a separate lifter actuator to effect vertical movement of the frame part;
- one or more of the support pins may be replaced by grooved part(s) or other supporting elements. FIG. 23 shows a supporting element 2331 of a grooved form. The groove is formed as a cut-out or similar concave profile that receives and supports the substrate 100. The supporting element 2331 may have a rounded or concave profile that contacts the substrate 100. The substrate is contacted only at its edge, or only at its sharp edge.
- the support pins or other supporting elements may be formed so that the substrate edge is supported by a smooth surface (i.e., not sharp); the smooth surface may be wavy having a plurality smooth curved points supporting the edge of the substrate.
- Any gas flow gap, such as for flow 14, 24, 25, or 28 can be implemented as a plurality of holes in the structure of 170/270, rather than a single gap to enable improved mechanical stability and attachments and possible adjustments of the gas flows.

In certain embodiments, the support part (170, 270 or similar) is detachable. In certain embodiments, the support part is transferred into the reactor (or reaction chamber) with a substrate loaded into it.

Figure 24:
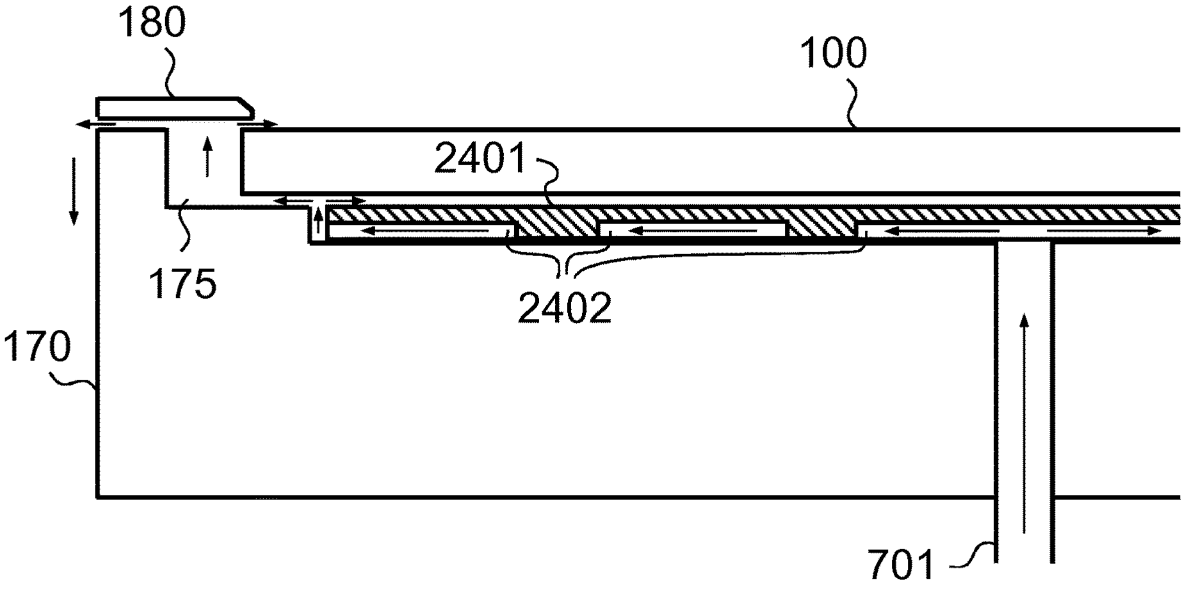
FIG. 24 shows a gas dispersion part in certain embodiments.

FIG. 24 shows an optional dispersion part (or flow dispersion part) to be fitted below the substrate 100 in any of the preceding embodiments. In certain embodiments, the dispersion part 2401 is a plate-like object, a gas dispersion plate. In certain embodiments, the part 2401 is positioned within the recessed area (see reference numeral 171 in the preceding) that remains under the bottom face of the substrate 100. The protective fluid in-feed line 701, which may be a vertical in-feed line extending through the base part 170 (or similar) provides the part 2401 with protective fluid. The part 2401 comprises channels 2402 in itself or forms gas passing pathways together with the recessed area to disperse the received protective fluid sideways. The flow of protective fluid generally travels from the in-feed line 701 similarly as shown in FIG. 10. Accordingly, the flow direction is from the in-feed line 701 to the pocket or cavity 175 and therefrom via the disclosed gaps to the exhaust. Before entering the pocket or cavity 175, a dispersed flow travels from the in-feed line 170 sideways (horizontally) until it turns into a vertical upwards directed flow at the edge of the part 2401. The upwards directed flow turns into horizontal flows when meeting the bottom face of the substrate 100. One part of the flow continues towards the pocket or cavity 175 and another part towards an opposite direction purging the backside of the substrate 100 (there is a gap in between the substrate bottom face and the part 2401).

Figure 25:
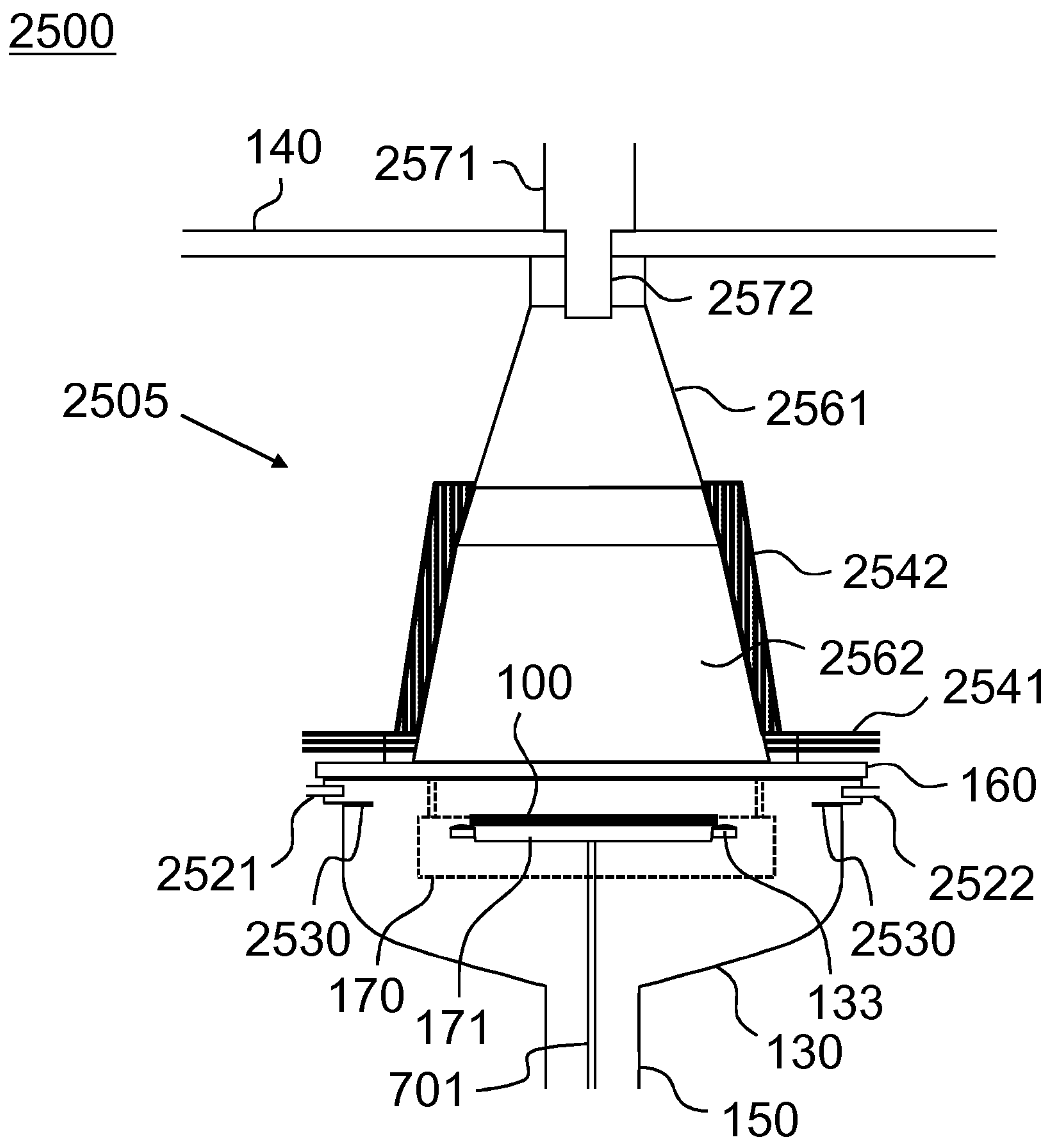
FIG. 25 shows a plasma enhanced atomic layer deposition apparatus according to certain embodiments.
Figure 26:
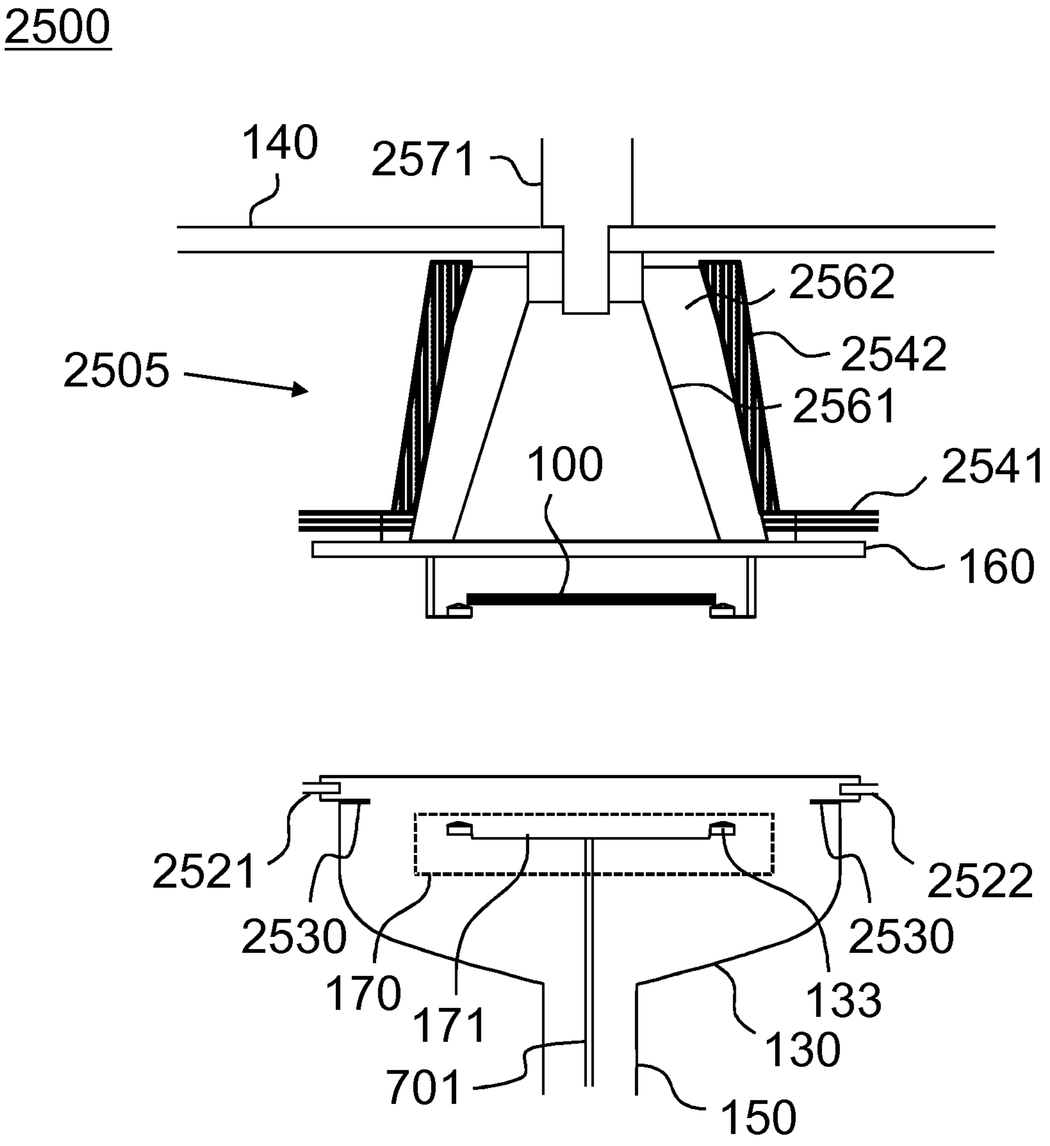
FIG. 26 shows the apparatus of FIG. 25 in a substrate loading stage.

FIGS. 25 and 26 show a plasma enhanced atomic layer deposition apparatus 2500 comprising a plasma in-feed part on top of the reaction chamber 130.

The apparatus 2500 generally correspond to the apparatus presented in the preceding embodiments as to substrate handling, e.g., loading and supporting substrate(s). Therefore, a reference is made to the preceding description. However, in the embodiments shown in FIGS. 25 and 26, certain further features is presented.

A deformable plasma in-feed part 2505 is positioned on top of the reaction chamber 130. The deformable in-feed part 2505 has a closed configuration for substrate processing, for example, by plasma-assisted ALD and an open configuration for substrate loading. In the closed configuration, the in-feed part 2505 may be in an extended shape, and in the open configuration in a contracted shape. The closed configuration is depicted in FIG. 25 and the open configuration in FIG. 26.

The deformable in-feed part 2505 comprises a set of nested sub-parts or ring-like members which are movable to fit within each other. In the embodiment shown in FIGS. 25 and 26, the number of sub-parts is two. The sub-parts 2561 and 2562 form a telescopic structure. In the example embodiment shown in FIGS. 25 and 26, the upper sub-part 2561 is attached to a wall of the vacuum chamber 140. The attachment may be in a top wall of the vacuum chamber 140. The in-feed part 2505 forms a widening flow path towards the reaction chamber 130 for plasma arriving from a plasma source tube 2571 via an inlet 2572 (a plasma source is positioned on the other side of the vacuum chamber 140 upper wall). The widening flow part may be a conical path formed by the sub-parts 2561 and 2562.

The lower sub-part 2562 in an embodiment forms the reaction chamber lid 160 or is attached to the reaction chamber lid 160. The lid 160 may have the form of a flat ring.

In certain embodiments, such as shown in FIGS. 25 and 26, the lid 160 either closes an interface between the lid 160 and the reaction chamber 130 (or reaction chamber wall) as depicted in FIG. 25 or provides for a loading gap for substrate loading into the reaction chamber 130 (and unloading from the reaction chamber 130) as depicted in FIG. 26.

A substrate 100 is supported by supporting elements (e.g., pins 133, etc., or similar) at a central area of the reaction chamber 130. Protective fluid flows via the channel 701 into the recessed area 171 provided by the base part 170. A dispersion plate (or insert) 2401 (not shown) may be positioned within the recessed area 171.

The apparatus comprises a plurality non-plasma gas inlets (e.g., inlets for precursor vapor and/or for purge gas) at sides of the reaction chamber 130. The number of non-plasma gas inlets in the perimeter or circumference of the reaction chamber 130 may be, for example, six. The apparatus optionally comprises a ring-like member 2530 that travels along an inner surface of a cylindrical side wall of the reaction chamber 130. This ring-like member 2530 that may be a ring or a flat ring is positioned just below the non-plasma gas inlets. The purpose of the member 2530 is to act as a sacrifice plate. Two of the inlets, namely inlets 2521 and 2522 are shown in FIGS. 25 and 26.

The apparatus 2500 comprises heat reflectors on top of the reaction chamber, for example, heat reflector plates 2541 horizontally oriented that are in certain embodiments attached to the lid 160 (in certain embodiments, the heat reflectors or plates 2541 extend to the sides and in certain embodiments also to the bottom side of the reaction chamber 130). In certain embodiments, the apparatus 2500 comprises a further heat reflector 2542 that conforms to the outer surface of at least part of the plasma in-feed part 2505, in particular the lower sub-part 2562. In certain embodiments, the apparatus 2500 comprises a heat reflector sleeve 2542 around the plasma in-feed part 2505.

As shown in FIG. 18*a*, a retractable shaft of an elevator 190 may be attached to the lid 160 or in connection with it. The elevator 190 may then operate (raise and lower) the lid 160 and the in-feed part 2505 (between the extended and contracted shape).

Plasma species travels as a vertical flow from the plasma source along the plasma source tube 2571 and through the inlet 2572 into the widening in-feed part 2505 and therefrom to the substrate 100. In certain embodiments, the inlet 2572 provides a constriction, a narrow passage, to increase gas velocity (the velocity of plasma species). In other words, the inlet 2572 is a tubular item with a diameter smaller than the diameter of the preceding plasma source tube 2571.

The various features presented in connection with the embodiments shown in FIGS. 25 and 26 may be used in the other embodiments presented in the foregoing.

Without limiting the scope and interpretation of the patent claims, certain technical effects of one or more of the example embodiments disclosed herein are listed in the following. A technical effect is providing a loading method with minimum particle generation. A further technical effect is preventing backside growth on a substrate.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments may be used to advantage without the corresponding use of other features. As such, the foregoing description should be considered as merely illustrative of the principles of the present disclosure, and not in limitation thereof. Hence, the scope of the aspects of the disclosed embodiments are only restricted by the appended patent claims.

The invention claimed is:

1. A substrate processing apparatus, comprising:

a susceptor having a supporting interface to receive a substrate;

a support part having a supporting interface;

a moving arrangement for moving the susceptor to bring the substrate into a contact with the supporting interface of the support part, and for further moving the susceptor to detach the substrate from the supporting interface of the susceptor;

an inlet to provide a protective fluid flow into a space in between the substrate and the support part; and a reaction chamber lid attached to the susceptor to effect the movement of the susceptor by moving the reaction chamber lid.

2. The apparatus of claim 1, wherein the supporting interfaces are configured to contact the substrate at substrate edges only.

3. The apparatus of claim 1, wherein the supporting interfaces are pin interfaces and the number of pins of the respective pin interfaces is three or four.

4. The apparatus of claim 1, wherein the apparatus is configured to bring the substrate into a contact with the supporting interface of the support part by a lowering movement of the susceptor.

5. The apparatus of claim 1, comprising:

side pockets in the support part to receive the lowered susceptor or parts of the lowered susceptor.

6. The apparatus of claim 1, comprising:

a frame part to be lowered onto the substrate leaving a gap therebetween.

7. The apparatus of claim 1, comprising:

an inlet and a recessed area in the support part to flow a protective fluid from the inlet to the recessed area underneath the substrate and therefrom to side pockets of the support part.

8. The apparatus of claim 1, comprising:

an upper counter surface, the apparatus being configured to detach by a lowering movement the reaction chamber from the upper counter surface to form a loading opening.

9. The apparatus of claim 1, comprising a vacuum chamber around a reaction chamber.

10. The apparatus of claim 1, wherein the apparatus is configured to deposit material on a top surface of the substrate by sequential self-saturating surface reactions.

11. The apparatus of claim 1, wherein the apparatus is a photon-enhanced atomic layer deposition reactor or a plasma-enhanced atomic layer deposition reactor.

12. A method in the substrate processing apparatus of claim 1, comprising:

receiving a substrate by the supporting interface of the susceptor;

moving the susceptor via the moving arrangement to bring the substrate into a contact with a supporting interface of a support part;

further moving the susceptor via the moving arrangement to detach the substrate from the supporting interface of the susceptor causing a protective fluid flow into a space in between the substrate and the support part via the inlet.

13. The method of claim 12, further comprising:

effecting the movement of the susceptor by moving the reaction chamber lid attached thereto.

* * * * *